(12) United States Patent
Tran

(10) Patent No.: US 6,894,915 B2
(45) Date of Patent: May 17, 2005

(54) METHOD TO PREVENT BIT LINE CAPACITIVE COUPLING

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 10/295,225

(22) Filed: Nov. 15, 2002

(65) Prior Publication Data

US 2004/0095795 A1 May 20, 2004

(51) Int. Cl.$^7$ ............................................... G11C 5/06
(52) U.S. Cl. ............................................. 365/63; 365/72
(58) Field of Search .................................... 365/63, 72

(56) References Cited

U.S. PATENT DOCUMENTS

| | | | |
|---|---|---|---|
| 5,042,011 A | 8/1991 | Casper et al. | 365/205 |
| 5,280,205 A | 1/1994 | Green et al. | 307/530 |
| 5,627,785 A | 5/1997 | Gilliam et al. | 365/189.01 |
| 5,702,969 A | 12/1997 | Lee | 437/52 |
| 5,736,761 A | 4/1998 | Risch et al. | 257/301 |
| 5,753,551 A | 5/1998 | Sung | 438/253 |
| 5,792,685 A | 8/1998 | Hammerl et al. | 438/243 |
| 5,827,770 A | 10/1998 | Rhodes et al. | 438/396 |
| 5,828,602 A * | 10/1998 | Wong | 365/185.2 |
| 5,858,833 A | 1/1999 | Lee et al. | 438/253 |
| 5,914,511 A | 6/1999 | Noble et al. | 257/302 |
| 6,048,767 A | 4/2000 | Terada | 438/262 |
| 6,127,228 A | 10/2000 | Lee | 438/262 |
| 6,218,236 B1 | 4/2001 | Economikos et al. | 438/249 |
| 6,243,311 B1 | 6/2001 | Keeth | 365/206 |
| 6,261,908 B1 | 7/2001 | Hause et al. | 438/280 |
| 6,303,424 B1 | 10/2001 | Lee et al. | 438/239 |
| 6,306,703 B1 | 10/2001 | Noble | 438/238 |
| 6,312,988 B1 | 11/2001 | Lowrey et al. | 438/255 |
| 6,335,237 B1 | 1/2002 | Tang et al. | 438/238 |
| 6,344,389 B1 | 2/2002 | Bronner et al. | 438/244 |
| 6,344,993 B1 * | 2/2002 | Harari et al. | 365/185.01 |
| 6,373,138 B1 | 4/2002 | Noble | 257/773 |
| 6,380,023 B2 | 4/2002 | Kerr et al. | 438/238 |
| 6,391,756 B1 | 5/2002 | Pan et al. | 438/597 |
| 6,455,407 B2 | 9/2002 | Pan et al. | 438/597 |
| 6,489,226 B2 | 12/2002 | Pan et al. | 438/597 |
| 6,545,904 B2 | 4/2003 | Tran | 365/149 |
| 6,600,190 B2 | 7/2003 | Lowrey et al. | 257/306 |
| 6,607,944 B1 | 8/2003 | Tran et al. | 438/129 |

* cited by examiner

*Primary Examiner*—Michael S. Lebentritt
*Assistant Examiner*—Pho M. Luu
(74) *Attorney, Agent, or Firm*—Schwegman, Lundberg, Woessner & Kluth, P.A.

(57) ABSTRACT

Structures, systems and methods for memory cells utilizing trench bit lines formed within a buried layer are provided. A memory cell is formed in a triple well structure that includes a substrate, the buried layer, and an epitaxial layer. The substrate, buried layer, and epitaxial layer include voltage contacts that allow for the wells to be biased to a de voltage level. The memory cell includes a transistor which is formed on the epitaxial layer, the transistor including a source and drain region separated by a channel region. The trench bit line is formed within the buried layer, and is coupled to the drain region of the transistor by a bit contact.

62 Claims, 15 Drawing Sheets

METHOD TO PREVENT BIT LINE CAPACITIVE COUPLING

CROSS REFERENCE TO RELATED APPLICATIONS

This application is related to the following U.S. patent application: "Trench Buried Bit Line Memory Devices and Methods Thereof", Ser. No. 10/295,106, filed Nov. 15, 2002 which disclosure is herein incorporated by reference.

FIELD OF INVENTION

The present invention relates generally to integrated circuit memory devices and, more particularly, to a method to prevent substrate to bit line and bit line to bit line capacitive coupling.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. Each DRAM cell includes an access transistor, e.g. a metal oxide semiconducting field effect transistor (MOSFET), coupled to a capacitor cell, and for that reason is referred to as a 1T1C cell. Data can be either stored in the memory cells during a write mode, or data may be retrieved from the memory cells during a read mode. The memory cells are referred to as dynamic because they must also be refreshed periodically to maintain data integrity. The access transistors of the memory cells connect to internal signal lines, referred to as bit or digit lines. The gates of the access transistors of the memory cells connect to addressing lines, referred to as wordlines. The wordline selects the transistor to be turned on, and the bit line is thus coupled to the capacitor cell via the induced channel of the transistor. The bit line voltage is increased or decreased a small amount depending on the charge stored in the capacitor cell. These small changes are amplified by the sense amp to a voltage level corresponding to a logic level 1 or logic level 0

During a read or refresh operation, each sense amplifier compares the voltage level on the bit line to be read with a known reference voltage, usually another bit line with a constant voltage, that is, a bit line whose voltage is not being affected by a capacitor cell. In the sensing operation, which is necessary to properly read the cell data and to refresh the memory cells, the two bit lines are first equalized to a reference voltage which is typically, but not limited to, one half of the supply voltage (Vcc). The voltage of the bit line to be read will increase or decrease depending on the charge stored on the cells capacitor. If the bitline being read corresponds to a logic level of 1, then the sense amplifier will increase the voltage on the bitline to Vcc, while decreasing the voltage on the reference bitline to 0, and vice versa if the bitline to be read corresponds to a logic level of 0.

With successive generations of DRAM chips, an emphasis continues to be placed on increasing array density and maximizing chip real estate, which increases the overall memory capacity of each memory device or decreases the overall size of each memory device.

One way to increase array density is to use an open bit line architecture. In this setting, each word line is connected to mbit transistors on every bit line, creating crosspoint-style arrays. The sense amplifiers are located between sub-arrays, and each sense amplifier compares bit line values of two bit lines, each bit line in the pair coming from separate sub-arrays. An alternative to the open bit line architecture is the folded bit line architecture, which requires more real estate to operate than the open bit line. In the folded bitline architecture, each wordline connects or forms a crosspoint with a memory cell transistor on every other bitline and must pass around memory cell transistors on the remaining bit lines. Sense amplifiers are placed at the edge of each array and connect to both true and complement bit lines coming from a single sub-array, thus the bitline and reference bitline are located next to each other. During a read operation, one of the bit lines connected to the sense amplifier is always rising to Vcc, while the other bitline connected to the same sense amplifier is always falling to 0. Thus, the folded bitline architecture has reduced bitline to substrate capacitive coupling in comparison with the open bit line architecture, due to a cancellation of the coupling effects by the opposite voltage levels of each bitline, but requires more area to operate.

In another effort to improve memory cell density, the capacitors can be formed within trenches, known as trench capacitors. The trenches must extend deep into the substrate, making the manufacturing process to form trench capacitors difficult. An alternative to this approach is to form the capacitor in another location, for example, in a stack configuration in which the capacitor is formed above the access transistor. These configurations however do not make effective use of the what would be the trench area of the cell, and thus leads to an overall larger memory array design.

For these reasons and others, what is needed is a method of reducing the substrate to bitline capacitive coupling created in the open bitline architecture, while striving to reduce the overall size of the device, thus increasing array density.

SUMMARY OF THE INVENTION

The above mentioned problems for increasing DRAM memory device density are addressed by the present invention and will be understood by reading and studying the following specification. This disclosure describes the use of a trench bit line, which will allow for the reduction of the memory array size by effective use of the available substrate real estate. Further, this disclosure describes the use of an additional buried layer, tailored to the type of trench bit line material used and coupled to a dc bias voltage source, which will significantly reduce the amount of capacitive coupling between the substrate and the trench bit line, as well as between adjacent trench bit lines.

In particular, an embodiment of the present invention includes a memory cell, consisting of a transistor formed on a substrate. The transistor consists of a source and drain region separated by a channel. The drain region of the transistor is coupled to a trench bit line by way of a bit contact, and the trench bit line is formed within a buried layer within the substrate. The buried layer is coupled to a dc voltage level, such that capacitive coupling between the trench bitline and the substrate and between the neighboring bit lines is reduced.

These and other embodiments, aspects, advantages, and features of the present invention will be set forth in part in the description which follows, and in part will become apparent to those skilled in the art by reference to the following description of the invention and reference drawings or by practice of the invention.

DETAILED DESCRIPTION

Figure 1A:
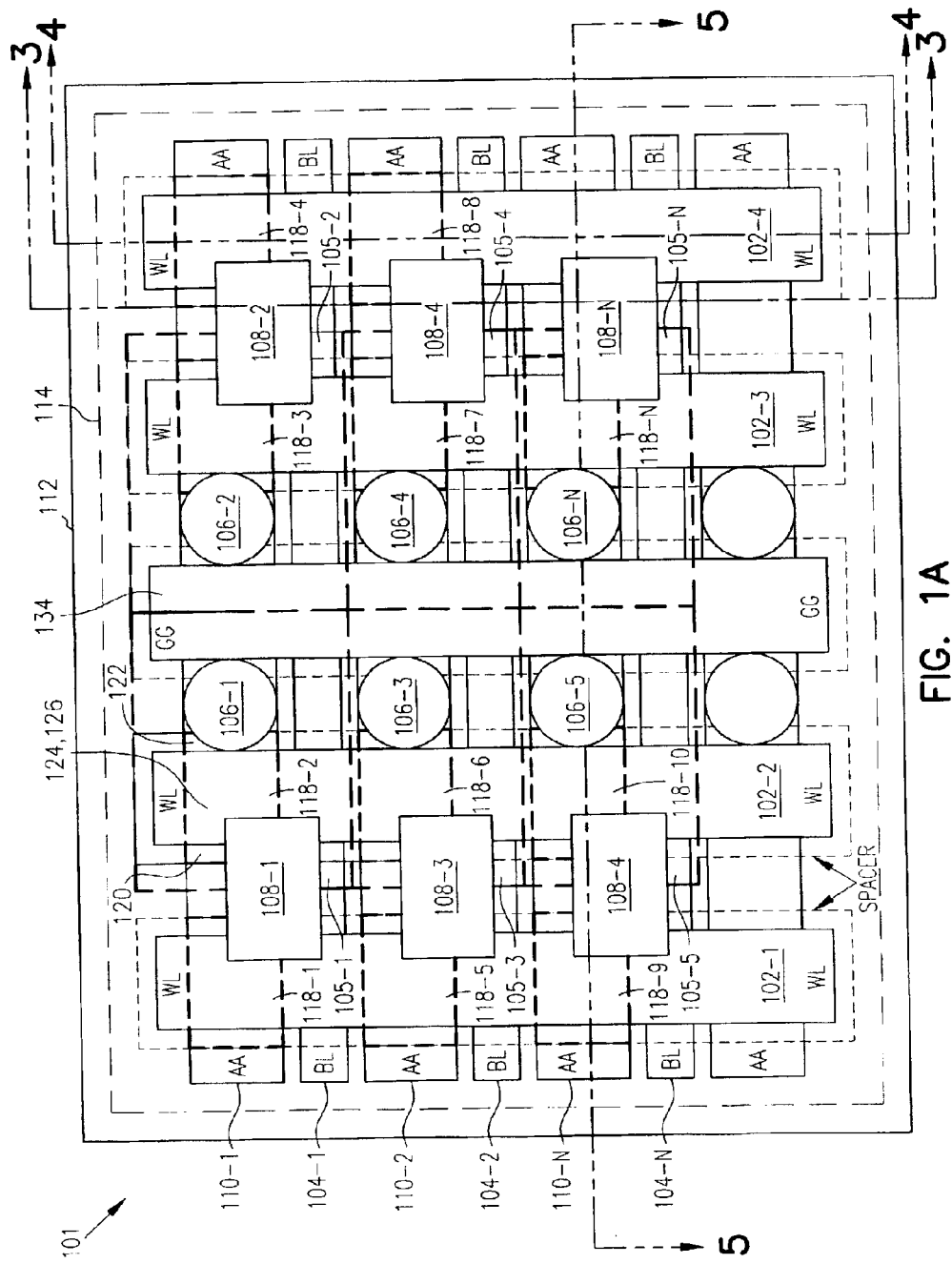
FIGS. 1A–B illustrate an embodiment of a memory array utilizing the open bit line architecture according to the teachings of the present invention.

In the following detailed description of the invention, reference is made to the accompanying drawings which form a part hereof, and in which is shown, by way of illustration, specific embodiments in which the invention may be practiced. In the drawings, number prefixes correspond to the figure number they appear in. For example, a number appearing in FIG. 2 would always begin with a 2. Similar structures found throughout the drawings can be identified by like suffixes. For example, if structure A is labeled 105 in FIG. 1, structure A will be labeled 205 in FIG. 2. Numbers in the drawings that include a dash followed by another number are meant to show like structures within the figure, but allow a particular structure to be discussed. These embodiments are described in sufficient detail to enable those skilled in the art to practice the invention. Other embodiments can be utilized and structural, logical, and electrical changes can be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The term like conductivity is understood to compare two materials, the conduction properties of each material being similar, although the materials themselves may differ. The terms source and drain are referred to as separate regions throughout the description to help physically describe the layout of the present invention, but include the same materials and properties and therefore may be interchanged without difficulty. The following detailed description is, therefore, not to be taken in a limiting sense, and the scope of the present invention is defined only by the appended claims, along with the full scope of equivalents to which such claims are entitled.

FIG. 1A is useful in illustrating the layout of an open bit line architecture as can be used in a memory array. The array of FIG. 1A shows a top view of the memory sub-array 101, which includes a number of memory cells 105-1, 105-2 . . . 105-N, wordlines 102-1, 102-2 . . . 102-N strips of active area 110-1, 110-2 . . . 110-N, and trench bit lines 104-1, 104-2 . . . 104-N which are parallel to and along side the strips of the active area 110-1, 110-2 . . . 110-N. Each strip of active area 110-1, 110-2 . . . 110-N is suitably doped to define a number of transistors such as transistor 118-2. For ease of illustration the details of transistor 118-2 are discussed further herein. However, as one of ordinary skill in the art will appreciate the other transistors 118-1, 118-3 . . . 118-N possess a similar structure. The transistor 118-2 includes a drain region 120, and a source region 122, separated by a channel region 126. The channel region 126 of the transistor 118-2 is located between the drain region 120 and the source region 122. The channel region 126 of the transistor 118-2 is located beneath the wordline 102-2 on the active area 110-1. A gate region 124 of the transistor 118-2 is located above the channel region 126. A storage cell 106-1 is coupled to the source region 122 of the transistor 118-2. A bit contact 108-1 is coupled to the drain region 120 of the transistor 118-2. The bit contact 108-1 is also coupled to the drain region of the adjacent transistor 118-1. In this embodiment of the present invention, each bit contact 108-1, 108-2 . . . 108-N couples a pair of memory cells 105-1, 105-2 . . . 105-N to a trench bit line 104-1, 104-2 . . . 104-N.

FIG. 1A shows a number of memory cells, such as memory cell 105-1, which makes up a sub-array of memory cells 101. In one embodiment, each memory cell such as memory cell 105-1 consists of only one transistor 118-2, and one storage cell or capacitor 106-1. The memory cells 105-1, 105-2, 105-3 . . . 105-N are accordingly referred to as 1T1C cells. For ease of discussion, the details of memory cell 105-1 are discussed further herein. However, as one of ordinary skill in the art will appreciate, the other memory cells 105-2, 105-3 . . . 105-N possess similar structure. Memory cell 105-1 stores binary data, represented as a logic level 1 or logic level 0, in the form of charge stored on the storage cell 106-1. The wordline 102-2 is coupled to the gate region 124 of the transistor 118-2, and turns the transistor 118-2 on and off like a switch. When the transistor 118-2 is turned "on" by the wordline 102-2, charge from the storage cell 106-1 is allowed to flow from the source region 122, across the channel region 126, and into the drain region 120. The drain region of transistor 118-2 is coupled to the trench bit line 104-1 per bit contact 108-1. The trench bit line 104-1 is coupled to a number of memory cells, e.g. 105-1 and 105-2. In one embodiment, the trench bit line 104-1, 104-2 . . . 104-N is formed of a conductive material such as Tungsten/Tungsten Nitride alloys (W/WN). The invention, however, is not so limited and other alloys such as Tungsten/Titanium Nitride (W/TiN) can also be used.

Figure 1B:
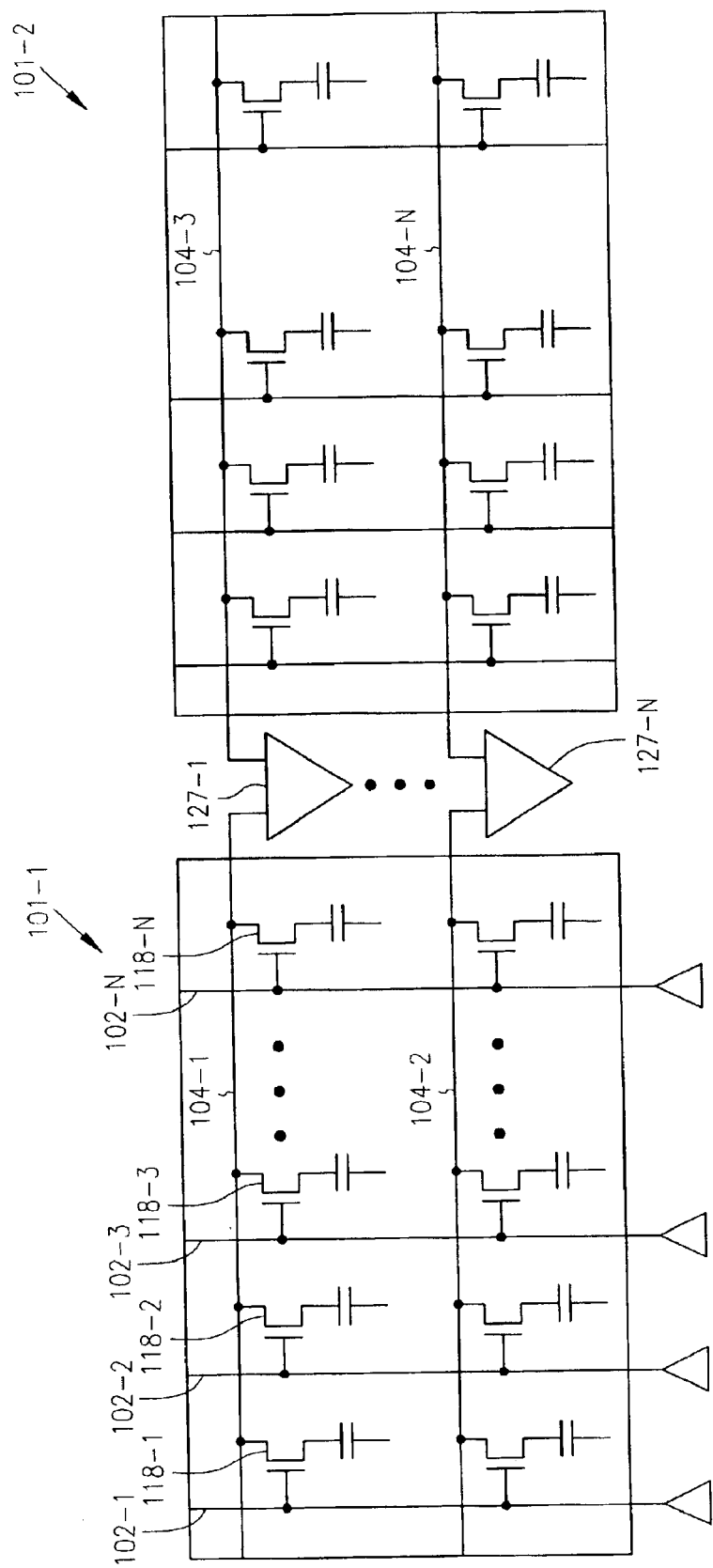

FIG. 1B is a schematic illustration of an open bit line architecture according to the teachings of the present invention. FIG. 1B illustrates a pair of memory sub-arrays 101-1 and 101-2. A number of sense amplifiers 127-1, 127-2 . . . 127-N are shown, each coupled to a pair of trench bitlines 104-1, 104-2 . . . 104-N. For ease of discussion the details of sense amplifier 127-1 is discussed further herein. However, as one of ordinary skill in the art will appreciate, the other sense amplifiers operate in similar manner. The sense amplifier 127-1 detects small voltage differences between the trench bit lines 104-1 and 104-3. The sense amplifier 127-1 then amplifies these voltage differences to voltage levels representing a logic level of either 1 or 0. During a read operation of trench bit line 104-1, the sense amplifier 127-1 uses the trench bit line 104-3 from the adjacent memory sub-array 101-2 as a reference value. The sense amplifier 127-1 compares the reference value from trench bit line 104-3 with the value of the trench bit line 104-1 being read. If the trench bit line 104-1 being read holds a small change in voltage representing a logic level of 1, then the trench bit line signal will be amplified by the sense amplifier 127-1 to a voltage level corresponding to a logic level of 1. The reference trench bit line 104-3 being used by the sense amplifier 127-1 will be amplified by the sense amp to a voltage representing a logic level of 0.

Figure 2A:
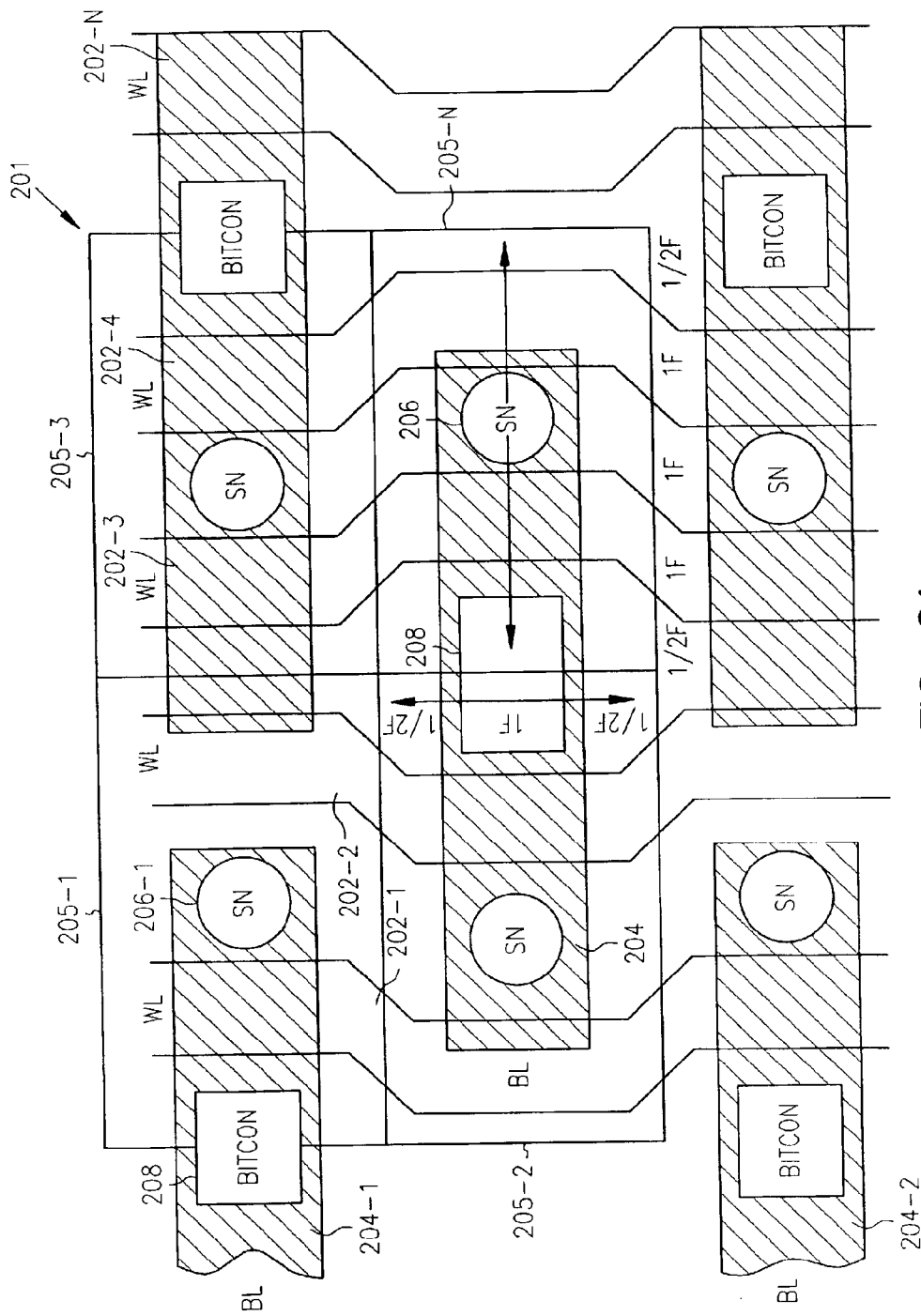
FIGS. 2A–B are diagrams of a folded bit line architecture.

As FIG. 1A shows, wordline 102-2 is coupled to a number of transistors, e.g. 118-2, 118-6 and 118-10 on every trench bit line 104-1, 104-2 . . . 104-N, creating crosspoint-style arrays. This is in contrast with the folded bit line architecture as illustrated in FIG. 2A. The wordlines 202-1, 202-2 . . . 202-N in FIG. 2A are coupled to memory cells 205-1, 205-2 . . . 205-N on every other bit line 204-1, 204-2 . . . 204-N in this arrangement. For example, wordline 202-1 is coupled to memory cell 205-1, which in turn is coupled to bit line 204-1. Wordline 202-1 is not coupled to memory cell 205-2 however, an additional wordline 202-2 is used to couple memory cell 205-2 to bit line 204-2. From FIG. 2A, it can be seen that the area required for each memory cell, using memory cell 205-N as an example, of FIG. 2A is 8F^2, or eight features squared. Comparing FIG. 1A to FIG. 2A, one of ordinary skill in the art will appreciate that the open bit line architecture requires less overall space than the folded bit line architecture, thus improving the density of a memory array utilizing the FIG. 1A architecture.

Figure 2B:
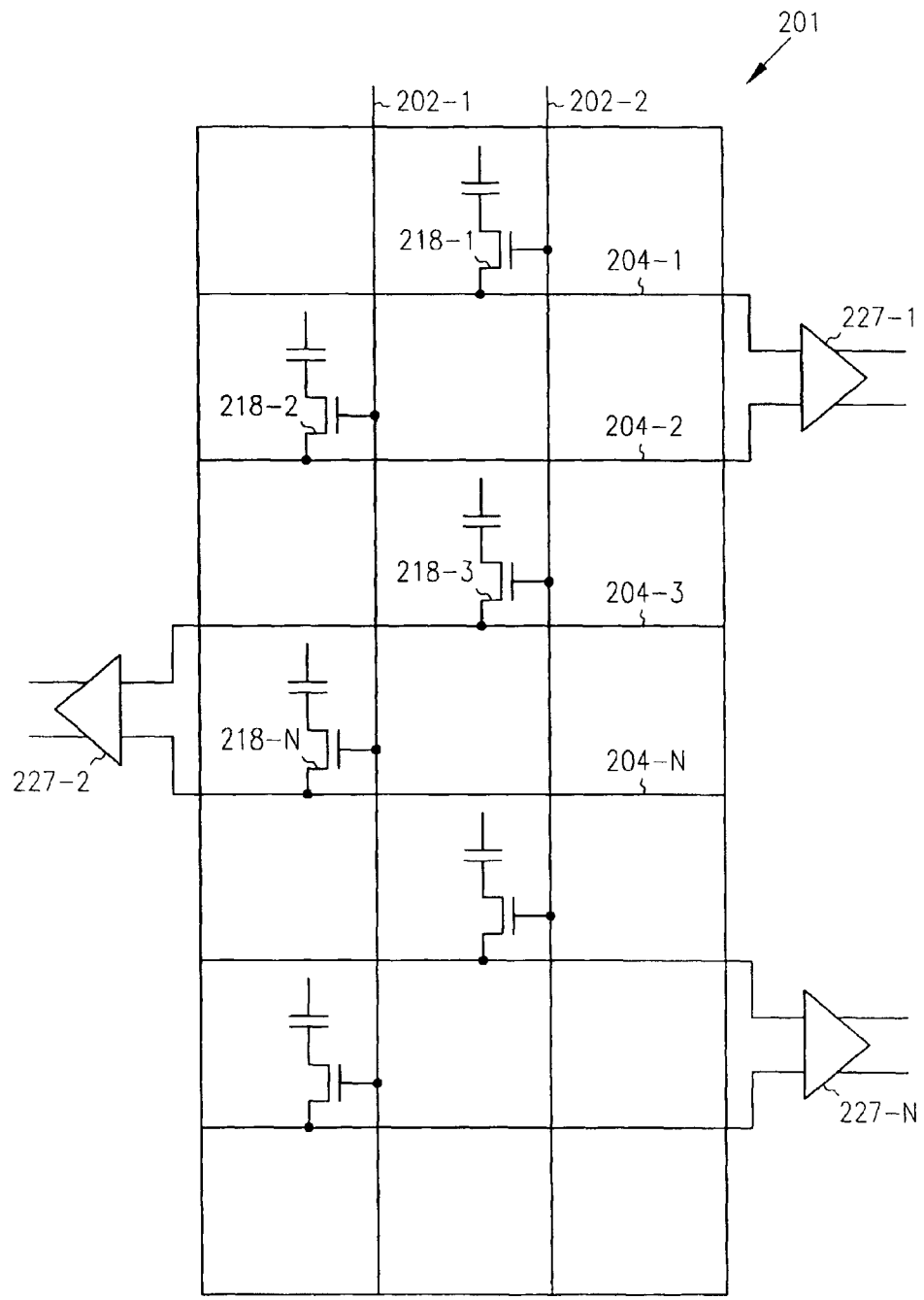

One important difference between the open bit line architecture and the folded bit line architecture, as illustrated in FIG. 1B and FIG. 2B, however, is in how the trench bit lines 104-1, 104-2 . . . 104-N of FIG. 1B and 204-1, 204-2 . . . 204-N of FIG. 2B are connected to the sense amplifiers 127-1 . . . 127-N and 227-1, 227-2 . . . 227-N, respectively. In the open bit line architecture of FIG. 1A, the sense amplifiers 127-1 . . . 127-N are located between the memory cell sub-array 101-1 and an adjacent memory cell sub-array 101-2. In one embodiment, as shown in FIG. 1B, sense amplifier 127-1 is coupled to trench bit line 104-1 from memory sub-array 101-1 and trench bit line 104-3 from memory sub-array 101-2. In contrast, the folded bit line architecture as shown in FIG. 2B couples each sense amplifier 227-1, 227-2 . . . 227-N to two neighboring bit lines 204-1, 204-2 . . . 204-N from the same sub-array 201-1. To further illustrate, take for example sense amplifier 227-1. Sense amplifier 227-1 is coupled to bit lines 204-1 and 204-2, which are neighboring bit lines taken from the same memory sub-array 201. Capacitive coupling effects between the bit lines and substrate are canceled in the folded bit line architecture due to the coupling of neighboring bit lines, e.g. 204-1 and 204-2, to a single sense amplifier, e.g. 227-1. The folded bit line architecture thus avoids some of the bit line 204-1, 204-2 . . . 204-N to substrate 212 capacitance problems seen by the open bit line architecture.

As discussed above, during a read operation, the reference bit line 204-2 and the bit line 204-1 being read will be driven by the sense amplifier 227-1 to opposite logic level voltages. Since the reference bit line 204-2 and the bit line 204-1 being read are located side by side, the capacitive coupling effect between the substrate and bit lines are canceled. In the open bit line architecture shown in FIG. 1B, the trench bit line 104-1 being read and reference trench bit line 104-3 are not side by side, and thus do not have the canceling effect seen in the folded architecture.

Figure 3:
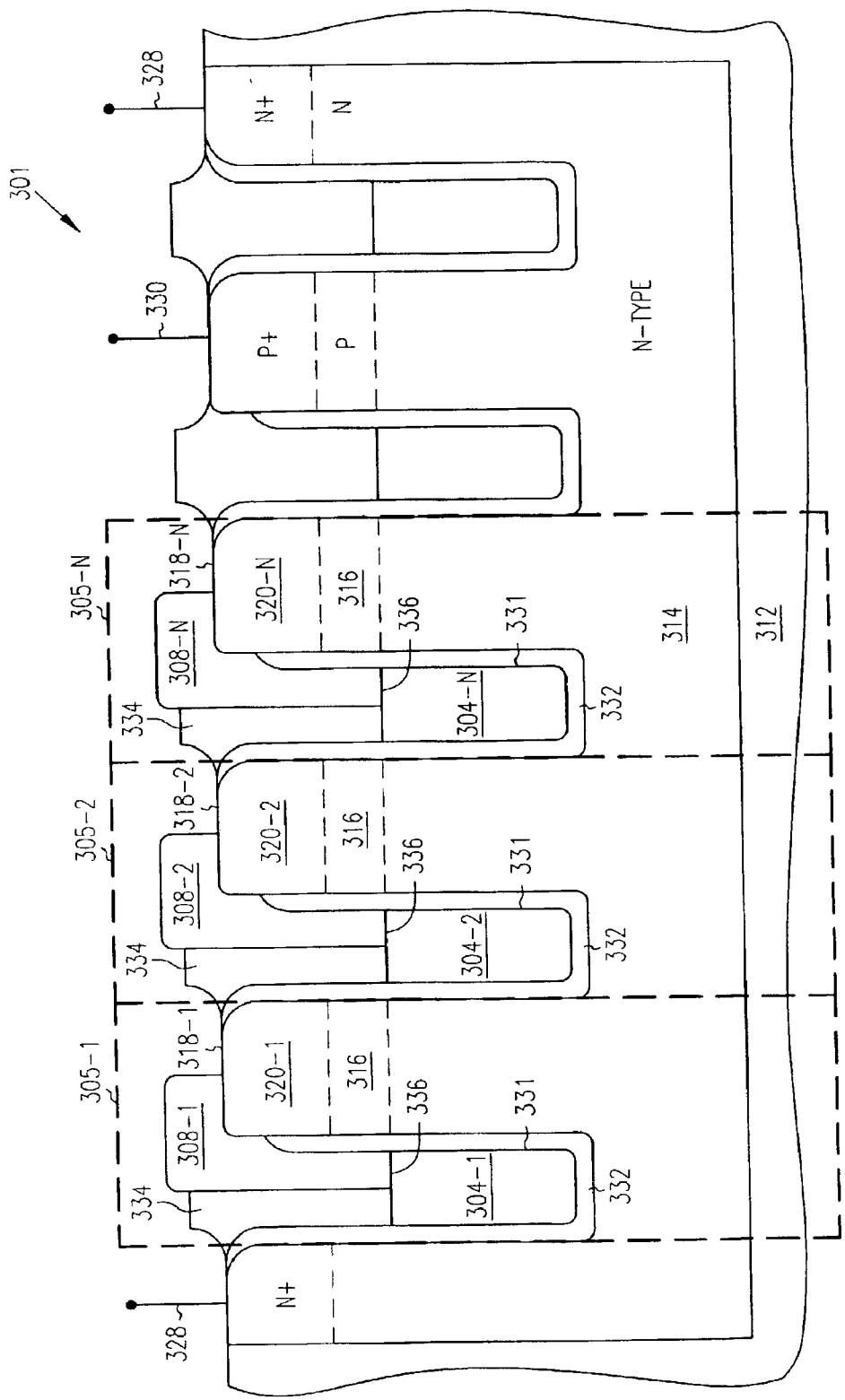
FIG. 3 is an embodiment of a memory array according to the teachings of the present invention and taken along cut line 3 in FIG. 1A.

FIG. 3 illustrates an embodiment of a memory array 301 according to the teachings of the present invention and taken along cut line 3 in FIG. 1A. A number of memory cells 305-1, 305-2 . . . 305-N are shown. For ease of illustration the details of memory cell 305-1 is discussed further herein. However, as one of ordinary skill in the art will appreciate the other memory cells 305-2 and 305-3 possess a similar structure. Furthermore, while only three memory cells are shown, the invention is not so limited to a fixed number of memory cells. Memory cell 305 includes a substrate 312, a buried layer 314 located within the substrate 312, an epitaxial layer 316 formed on top of the buried layer 314, and a transistor 318-1 formed on top of the epitaxial layer 316. As one of ordinary skill in the art will appreciate, the transistors 318-1, 318-2 . . . 318-N shown in FIG. 3 possess similar structure. The transistor 318-1 includes a drain region 320-1, along with a source region, a channel, and a gate region, which are located behind the drain region 320-1 shown in the cross-sectional view of FIG. 5. The channel is formed in the epitaxial layer 316, which extends into the area between the drain region 320-1 and the source region as shown in more detail in FIG. 4. The epitaxial layer 316 appears disconnected in the embodiment shown in FIG. 3, but is actually a single continuous layer, or well, the trench bit lines 304-1, 304-2 . . . 304-N interspersed therein, but connected at the periphery of the memory sub-array 301. The epitaxial layer 316, is formed within the buried layer 314, which is shown in more detail in FIG. 6.

A number of trench bit lines 304-1, 304-2 . . . 304-N are shown in FIG. 3. For ease of discussion, the details of trench bit line 304-1 will be discussed further herein. However, as one of ordinary skill in the art will appreciate the other trench bit lines 304-2 . . . 304-N possess similar structure. Trench bit line 304-1 is coupled to memory cell 305-1, the trench bit line 304-1 being located within the buried layer 314. The trench bit lines 304-1, 304-2 . . . 304-3 each being surrounded by an insulating layer 332, a side insulating liner 331, a top insulating liner 336, and a top insulating layer 334. In one embodiment, by way of example and not by way of limitation, the insulating liners 331, 336 are formed of a nitride material, and the insulating layers 332, 334 are formed of an oxide. Referring to memory cell 305-1, although one of ordinary skill in art will appreciate that the other memory cells 305-2 . . . 305-N possess a similar structure, the trench bit line 304-1 is coupled to the drain region 320-1 of the transistor 318-1 by a conductive bit contact 308-1. In one embodiment, by way of example and not by way of limitation, the bit contacts 308-1, 308-2 . . . 308-N are formed of a Titanium Silicide/Titanium Nitride alloy.

FIG. 3 further illustrates the coupling of the buried layer 314 to a dc voltage by a voltage contact 328. The epitaxial layer 316 is coupled to a dc voltage by a voltage contact 330. The substrate 312 is also coupled to a dc voltage by a voltage contact, shown in FIG. 6. The voltages coupled to the layers will vary depending on the device characteristics desired, but will not change during operation of the device, e.g. the voltages do not swing, but are held constant throughout operation.

Figure 5:
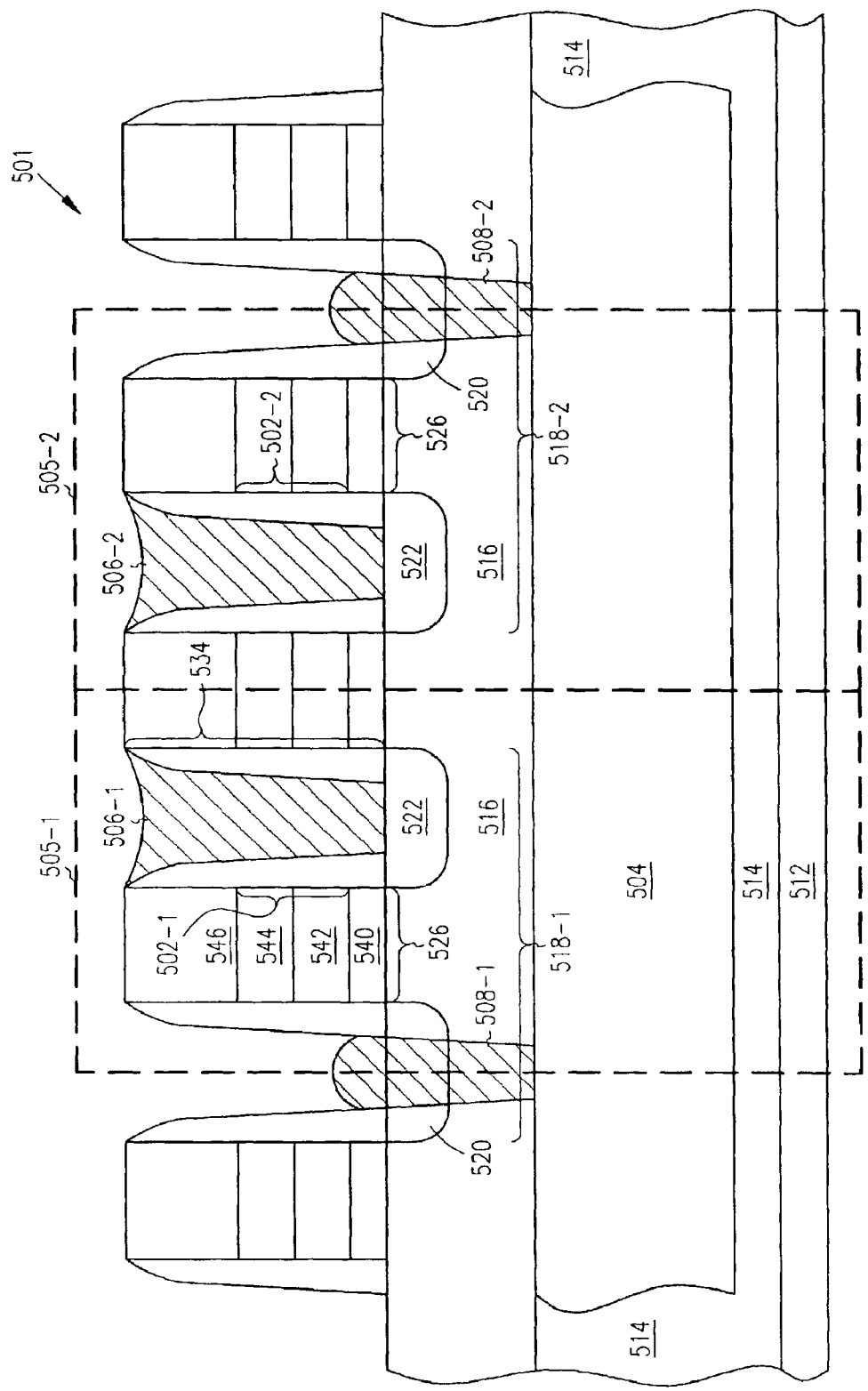
FIG. 5 is an embodiment of a memory array according to the teachings of the present invention and taken along cut line 5 in FIG. 1A.

In operation, the trench bit lines 304-1, 304-2 . . . 304-N are used to write and read logic levels to and from a storage cell, shown in FIG. 5. As will be understood by one of ordinary skill in the art, in one embodiment, a logic level of 0 corresponds to a voltage of 0 V, and a logic level of 1 corresponds to a voltage level of Vcc. In this embodiment, the bit lines 304-1, 304-2 . . . 304-N will carry a voltage which ranges between 0 and Vcc. In the folded bit line architecture of FIG. 2B, the bit line 204-1 and the reference bit line 204-2 are connected to the same sense amplifier 227-1 and are therefore always of opposite potential during a read operation, which results in a canceling of the substrate 212 to bit line 204-1, 204-2 . . . 204-N capacitive coupling. In the open bit line architecture of FIG. 3 however, the trench bit lines 304-1, 304-2 . . . 304-N are not connected to the same sense amplifiers, not shown in this view, and therefore are not complements of one another. Trench bit lines 304-1, 304-2 . . . 304-N may therefore carry a logic level of 1 at the same time, causing an increase in the substrate 312 to trench bit line 304-1, 304-2 . . . 304-N capacitive coupling, which reduces the overall sensitivity of the trench bit lines 304-1, 304-2 . . . 304-N.

In one embodiment, the substrate 312 includes a P-type semiconductor material, which is coupled to ground. In this embodiment, the buried layer 314 includes an N-type semiconductor material, which is coupled through the voltage contact 328 to a dc voltage level of Vcc. According to the teachings of the present invention, the trench bit lines 304-1, 304-2 . . . 304-N are of a material with a chosen conductivity (e.g. less resistivity), and surrounded by a heavily doped buried material 314, in a manner such that a potential of the buried material 314 can be solidly and firmly held at a dc bias. In one embodiment, if the trench bit lines 304-1, 304-2 . . . 304-N are made with a doped polysilicon, then both the trench bit lines 304-1, 304-2 . . . 304-N and the buried material 314 are heavily doped. Thus, in one embodiment, the trench bit lines 304-1, 304-2 . . . 304-N are formed of a Tungsten/Tungsten Nitride alloy (W/WN), and the buried layer 314 is a heavily doped (n+) type material in a manner such that a potential of the buried material 314 can be solidly and firmly held at a dc bias. As one of ordinary skill in the art will understand upon reading this disclosure, other refractory metals, which can withstand higher processing temperatures, can be selected for the trench bit lines 304-1, 304-2 . . . 304-N, the invention is not so limited.

In the embodiment shown in FIG. 3, the epitaxial layer 316 includes a lightly doped p-type semiconductor material, and is coupled through the voltage contact 330 to a voltage level of, for example, between 0.0 and −0.8 V. These values are not meant to limit the range of voltages that can be applied, but are used to illustrate a mode of operation of the device. By applying a voltage level of Vcc to the buried layer 314, the junctions between the heavily doped N-type buried layer 314 and both the P-type substrate 312 and the lightly doped P-type epitaxial 316 are reverse biased. The benefit of using a voltage level of Vcc, is that charge is supplied by Vcc, which can be attracted to the trench bit lines 304-1, 304-2 . . . 304-N as needed to provide a buffer. By coupling the buried layer 314 to a dc voltage bias per voltage contact 328, a stationary node is created, and in effect prevents the substrate 312 and the epitaxial layer 316 from detecting changes in the trench bit lines signal, thus improving the overall sensitivity and operation of the trench bit lines 304-1, 304-2 . . . 304-N. Also, by coupling the buried layer 314 to a dc voltage bias per voltage contact 328, the capacitive coupling between trench bit lines 304-1, 304-2 . . . 304-N is reduced, due to the buffer created by the dc biased buried layer 314.

In the above embodiment, when applying a voltage level of Vcc to the buried layer 314, the junctions between the N-type semiconductors and the P-type semiconductor materials in the substrate 312, the buried layer 314, and the epitaxial layer 316, will form depletion layers. The height and depth of the epitaxial layer 316 can be increased in some embodiments to prevent the depletion region created at the junction of the buried layer 314 and epitaxial layer 316 from extending into the drain regions 320-1, 320-2 . . . 320-N and the source regions of the transistors 318-1, 318-2 . . . .318-N.

In another embodiment according to the teachings of the present invention, the buried layer 314 is coupled to a voltage contact 328, but is biased to a voltage level of 0 V, rather than Vcc. By coupling the buried layer 314 to a dc voltage bias 328 set to 0 V, a stationary node is created, and in effect prevents the substrate 312 and epitaxial layer 316 from detecting changes in the trench bit lines 304-1, 304-2 . . . 304-N signal, thus improving the overall sensitivity and operation of the trench bit lines 304-1, 304-2 . . . 304-N. A benefit of biasing the buried layer 314 to ground is that ground provides a more solid potential than Vcc in those cases in which Vcc is to be generated from an on-chip regulator. The junctions created between the buried layer 314 and both the epitaxial layer 316 and the substrate 312 are to be reversed bias. Which means in the embodiment discussed above by way of example, and not by way of limitation, with the buried layer 314 including N-type semiconductor material, and both the substrate 312 and the epitaxial layer 316 including P-type semiconductor material, the buried layer 314 will have a more positive voltage level than both the substrate 312 and the epitaxial layer 316.

As one of ordinary skill in the art will understand upon reading this disclosure, the voltages applied to the substrate 312, the buried layer 314, and the epitaxial layer 316 can be varied to change the characteristics of the depletion regions created as well as the capacitive coupling between the substrate 312 and the trench bit lines 304-1, 304-2 . . . 304-N.

Figure 4:
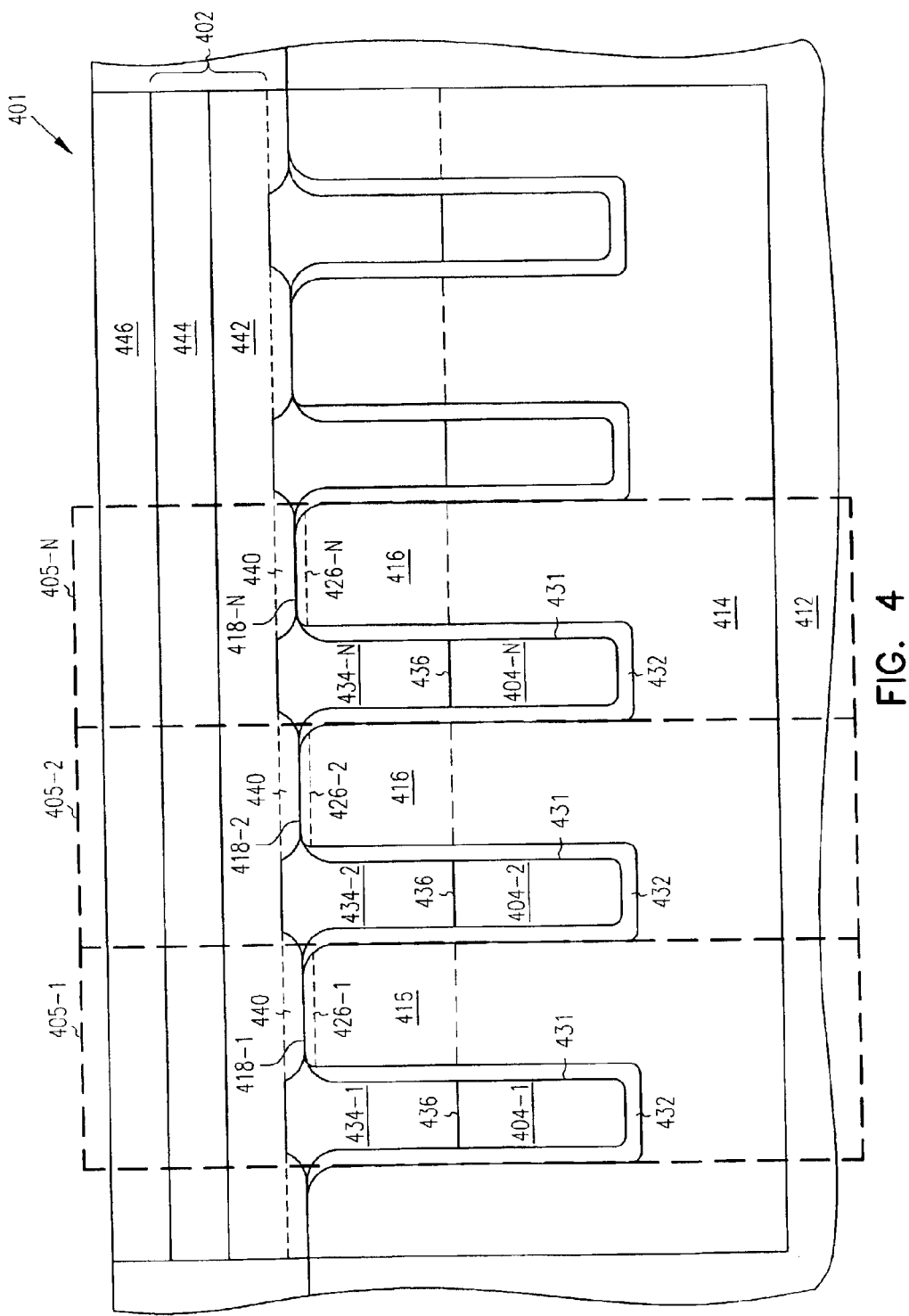
FIG. 4 is an embodiment of a memory array according to the teachings of the present invention and taken along cut line 4 in FIG. 1A.

FIG. 4 is an embodiment of a memory array 401 according to the teachings of the present invention and taken along cut line 4 in FIG. 1A. For ease of illustration and discussion, the details of individual memory cell 405-1 are discussed further herein. However, as one of ordinary skill in the art will appreciate the memory cells 405-1, 405-2 . . . 405-N possess a similar structure. The cross section over the channel regions 426-1 shows the orientation of the wordline 402, which was not visible in the previous figure. In FIG. 3 the cross section was taken over the drain region 320-1 of the transistor 318-1. FIG. 3 further showed the bit contact 308-1 coupling the drain region 320-1 to the trench bit line 304-1. In FIG. 4, the drain region is not visible, but the channel region 426-1 of the transistor 418-1 is. The channel region 426-1 is formed in the epitaxial layer 416 when the transistor 418-1 is turned on. When the transistor 418-1 is turned on, and a channel region 426-1 is formed, a conductive path is formed between the source and drain regions, shown in FIG. 5.

Continuing to use memory cell 405-1 for ease of illustration and discussion, in the trench area above the trench bit line 404-1 of FIG. 4 is illustrated an insulating layer 434-1. The insulating layer 434-1 isolates the bit contact, shown in FIG. 3, and the trench bit line 404-1 from the channel region 426-1. The trench bit lines 404-1, 404-2 . . . 404-N are each surrounded by an side liner 431, a top liner 436 and further by an insulating layer 432, which isolates the trench bit lines 404-1, 404-2 . . . 404-N from the buried layer 414. The wordline 402 is shown in an orientation perpendicular to the trench bit lines 404-1, 404-2 . . . 404-N, running horizontally along the page. The wordline 402 includes a gate polysilicon layer 442 and a conductive layer 444 which carry the word line signal. The wordline 402 is separated from the channel regions 426-1, 426-2 . . . 426-N by a gate insulating layer 440. An insulating layer 446 is also shown in FIG. 4, formed on top of the wordline 402.

In one embodiment according to the teachings of the present invention, the conductive layer 444 of wordline 402 includes a Tungsten (W/Wnx) alloy material, the invention however is not so limited. In this embodiment, by way of example and not by way limitation, the wordline 402 includes a layer 442 that is formed of a polysilicon material. The wordline 402 is formed over a gate insulating layer 440 that includes an oxide material. The gate insulating layer 440 separates the polysilicon gate layer 442 of the wordline 402 from the channel regions 426-1, 426-2 . . . 426-N. In this embodiment, the substrate 412 includes a P-type semiconductor material. The buried layer 414, which is formed within the P-type substrate 412 in this embodiment, includes an N-type semiconductor material. The epitaxial layer 416, which is formed within the N-type buried layer well 414 in this embodiment, includes a P-type semiconductor material. The channel regions 426-1, 426-2 . . . 426-N are formed within this P-type epitaxial layer 416 in this embodiment. The source region and drain region, shown in FIG. 5, include an N-type semiconductor material in this embodiment.

The transistors 418-1, 418-2 . . . 418-N are turned "on" when the voltage applied to the wordline 402 is sufficient to create the conductive channel regions 426-1, 426-2 . . . 426-N, respectively. This allows current to flow between the source region and the drain regions, shown in FIG. 5, effectively coupling the trench bit lines 404-1, 404-2 . . . 404-N to the storage cells, shown in FIG. 5.

FIG. 5 is an embodiment of a memory array 501 according to the teachings of the present invention and taken along cut line 5 of FIG. 1A. In the embodiment of FIG. 5, a number of memory cells are shown, e.g. 505-1, 505-2. The invention however is not limited to any number of memory cells. As shown in FIG. 5 the trench bit line 504 is coupled to the number of memory cells, 505-1, 505-2, per bit contacts 508-1 and 508-2, respectively. Although FIG. 5 shows the trench bit line 504 coupled to only a pair of memory cells 505-1, 505-2, it is not so limited, as one of skill in the art will appreciate the trench bit line 504 may be coupled to any number of memory cells along a trench housing a trench bit line 504, and running into the page of FIG. 5. Although it appears from this view that both the bit contacts 508-1, 508-2 and the trench bit line 504 simply extend beneath the transistors 518-1, 518-2, they are in fact located to the side and extend beneath the transistors 518-1, 518-2. To illustrate this point further, reference is again made to FIG. 1, which shows the trench bit lines 104-1, 104-2 . . . 104-N are located in the trench formed alongside the active areas 110-1, 110-2 . . . 110-N, respectively, in which the transistors 118-1, 118-2 . . . 118-N are formed.

As shown in FIG. 5, the wordlines 502-1, 502-2 . . . 502-N are located over the channel regions 526-1, 526-2 . . . 526-N, respectively. For ease of illustration the details of memory cell 505-1 are discussed further herein. However, as one of ordinary skill in the art will appreciate the memory cells 505-1, 505-2 . . . 502-N possess a similar structure. In this embodiment, memory cell 505-1 includes a wordline 502-1. The wordline 502-1 includes a gate polysilicon layer 542 and a conductive layer 544, which together carry the wordline signal. The wordline 502-1 is separated from the channel region 526 of the transistor 518-1 by an gate insulating layer 540. An insulating layer 546 is located on top of the wordline 502-1. In this embodiment, the source region 522 of the transistor 518-1 is located under the storage cell 506-1, and is coupled to the bit contact 508-1 by way of the transistor 518-1. The transistor 518-1 is controlled by the wordline 502-1. The storage cells 506-1 and 506-2 are kept electrically isolated from one another by an isolation gate stack 534 having a poly layer underneath the stack. The isolation gate 534 can include the same materials as the wordlines 502-1, and 502-2, and/or alternatively the isolation gate 534 can be selectively doped with p+ type doping in the poly layer, and/or alternatively the isolation gate 534 can be left un-doped. The isolation gate 534 does not carry a wordline signal. That is, the isolation gate 534 does not control the operation of the transistors 518-1 or 518-2, but rather it insulates the neighboring storage cells 506-1 and 506-2 from one another.

Figure 6:
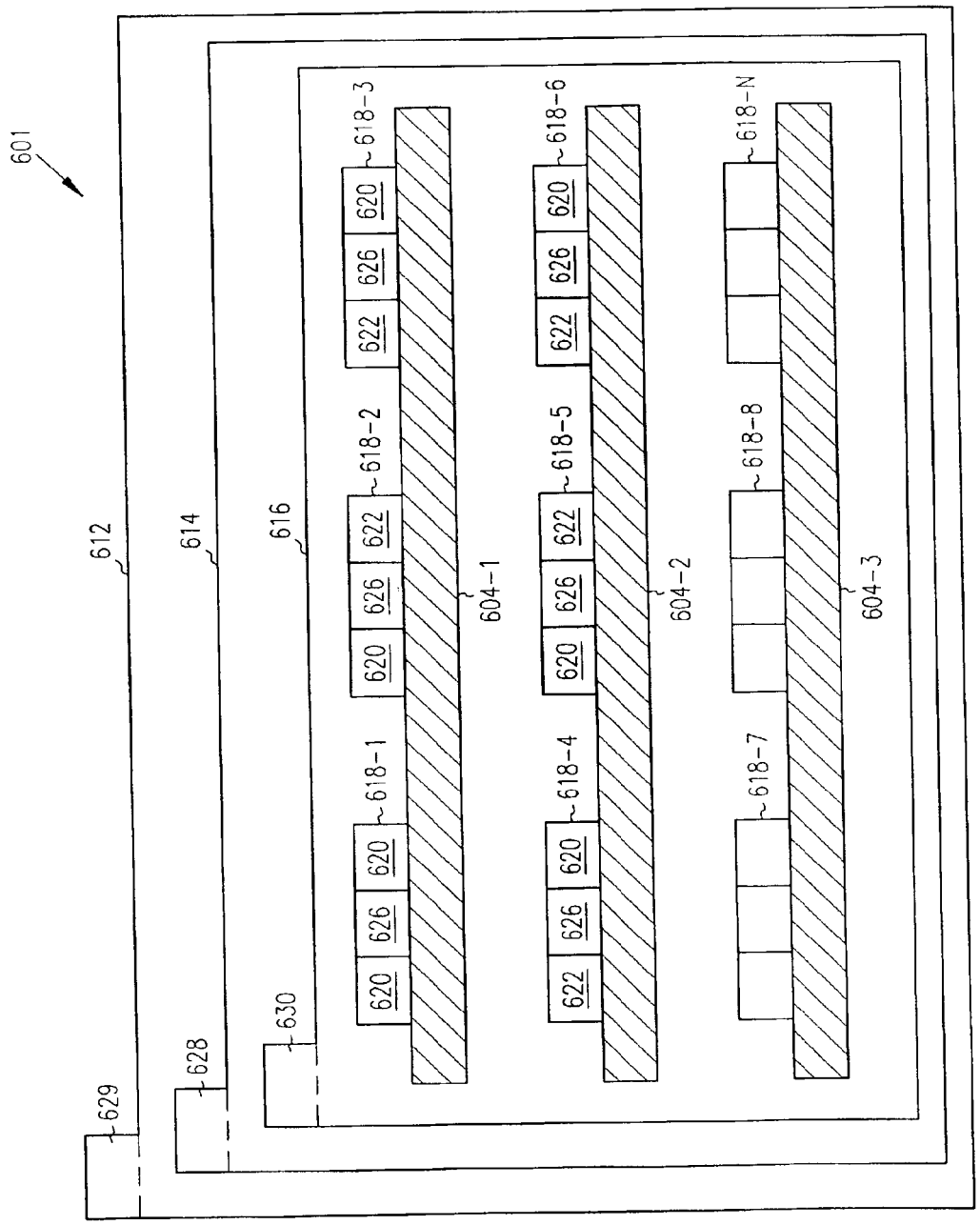
FIG. 6 is a top view of an embodiment of a memory array according to the teachings of the present invention emphasizing the triple well layout.

FIG. 6 is a top view of an embodiment of a memory array 601 according to the teachings of the present invention emphasizing the triple well layout. A base layer or substrate 612 is the bottom or first well. It is coupled to a dc voltage bias or potential by a voltage contact 629. Within the substrate 612, a buried layer 614 is formed. The buried layer 614 is the second well, shown in FIG. 6, and sits within the first well or substrate 612. The buried layer 614 is coupled to a dc voltage bias or potential by a voltage contact 628. Within the buried layer 614, the epitaxial layer 616 is formed. The epitaxial layer 616 makes up the third and final well of the triple well design. The epitaxial layer is also coupled to a dc voltage bias or potential by a voltage contact 630. As discussed above, previous figures appeared to show the epitaxial layer 616 as disconnected, but FIG. 6 illustrates that it is one continuous layer, connected at the periphery.

A number of transistors 618-1, 618-2 . . . 618-N are shown, each within formed on top of the epitaxial layer. For ease of illustration and discussion the details of transistor 618-1 are discussed further herein. However, as one of ordinary skill in the art will appreciate the transistors 618-1, 618-2 . . . 618-N possess a similar structure. In this embodiment, transistor 618-1 consists of a source 622-1 and a drain 620-1, which are formed within the epitaxial layer 616. The source 622-1 and drain 622-1 are separated by the epitaxial layer, which serves as the channel 626-1 of the transistor 618-1. In this embodiment, a trench bit line 604-1 is formed alongside the transistor 618-1. The trench bit lines 604-1, 604-2 . . . 604-N are recessed down through the epitaxial layer 616 and a portion of the buried layer 614.

In one embodiment the substrate 612 would include a P-type semiconductor material; the invention is not so limited however. In this embodiment, the buried layer 614 would include an N-type semiconductor material, and the epitaxial layer 616 would include a P-type semiconductor material. Both the source 622 and the drain 620 regions would include N-type semiconductor material. In this embodiment the substrate 612, by way of example and not of limitation, is coupled via contact 629 to a ground potential or a slightly negative potential. In this embodiment, the buried layer 614, needing to be biased to a more positive voltage than the substrate 612 in order to ensure a reverse biased junction, would be coupled via voltage contact 628 to a potential ranging from 0 to Vcc, depending on the voltage bias of the substrate 612. The epitaxial layer 616, needing to be biased to a voltage less positive than the buried layer in this embodiment, is coupled to a dc voltage bias via contact 630. The invention is not limited to any definite voltage levels, as one of ordinary skill in the art will appreciate, many combinations of voltages can be used.

Alternatively, in another embodiment, the substrate 612 could include a N-type semiconductor material. In this embodiment, the buried layer 614 would include a P-type semiconductor material, and the epitaxial layer 616 would include an N-type semiconductor material. In this embodiment, the source 622 and drain 620 regions would both include P-type semiconductor material. The junctions between the wells will be reverse biased, so each layer would be biased via the voltage contacts 628, 629, and 630 accordingly.

Sample Device Applications

Figure 7:
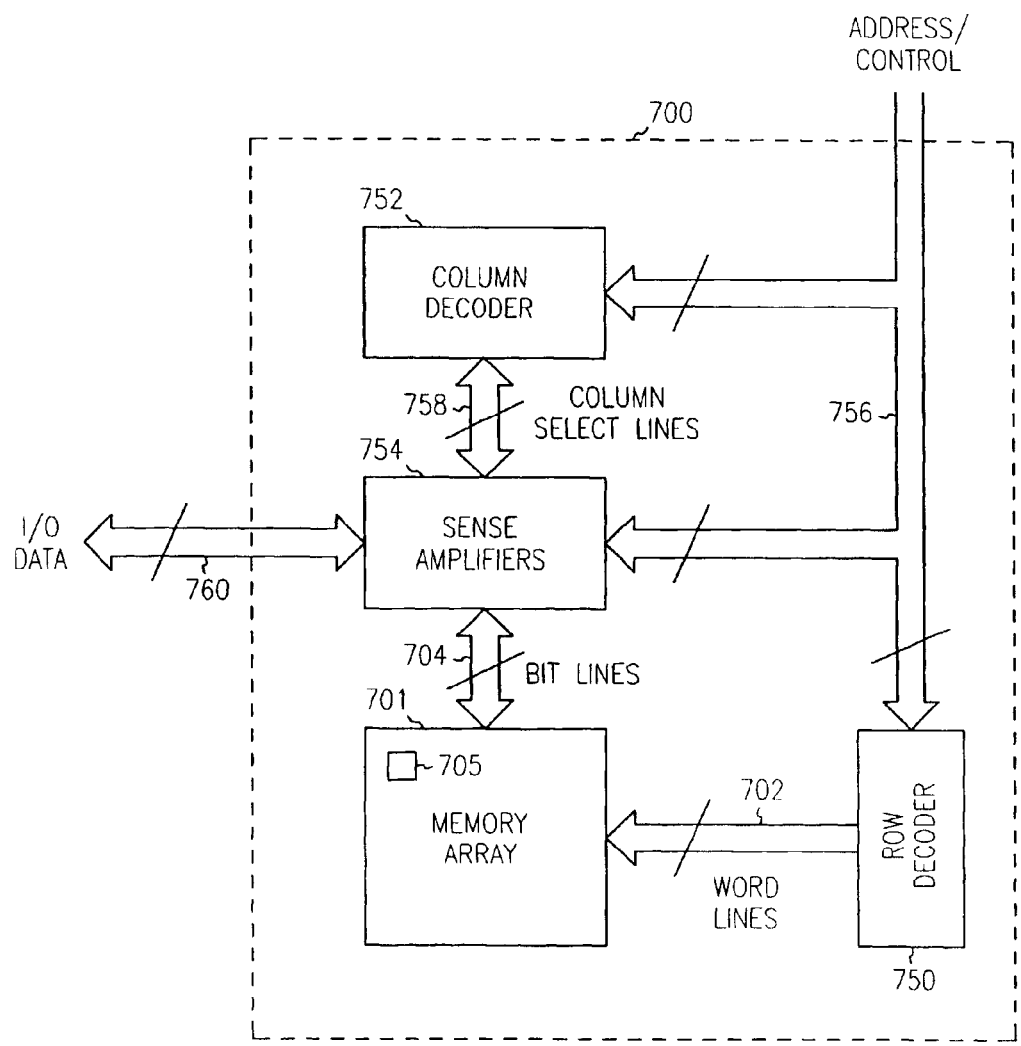
FIG. 7 illustrates an embodiment of a memory device according to the teachings of the present invention.

In FIG. 7 a memory device is illustrated according to the teachings of the present invention. The memory device 700 contains a memory array 701, row and column decoders 750, 752 and a sense amplifier circuit 754. The memory array 701 consists of a plurality of memory cells 705, whose word lines and trench bit lines are commonly arranged into rows and columns, respectively. As one of ordinary skill in the art will recognize, the memory cells' trench bit lines are formed as described according to the teachings of the present invention. The trench bit lines of the memory array 701 are connected to the sense amplifier circuit 754, while its word lines are connected to the row decoder 750. Address and control signals are input on address/control lines 756 into the memory device 700 and connected to the column decoder 752, sense amplifier circuit 754 and row decoder 750 and are used to gain read and write access, among other things, to the memory array 701.

The column decoder 752 is connected to the sense amplifier circuit 754 via control and column select signals on column select lines 758. The sense amplifier circuit 754 receives input data destined for the memory array 701 and outputs data read from the memory array 701 over input/output (I/O) data lines 760. Data is read from the cells of the memory array 701 by activating a word line (via the row decoder 750), which couples all of the memory cells corresponding to that word line to respective trench bit lines, which define the columns of the array. One or more trench bit lines are also activated. When a particular word line and trench bit lines are activated, the sense amplifier circuit 754 connected to a trench bit line column detects and amplifies the conduction sensed through a given transistor cell and transferred to its trench bit line by measuring the potential difference between the activated bit line and a reference line which can be an inactive bit line. Again, in the read operation the source region of a given cell is couple to a grounded sourceline or array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 8:
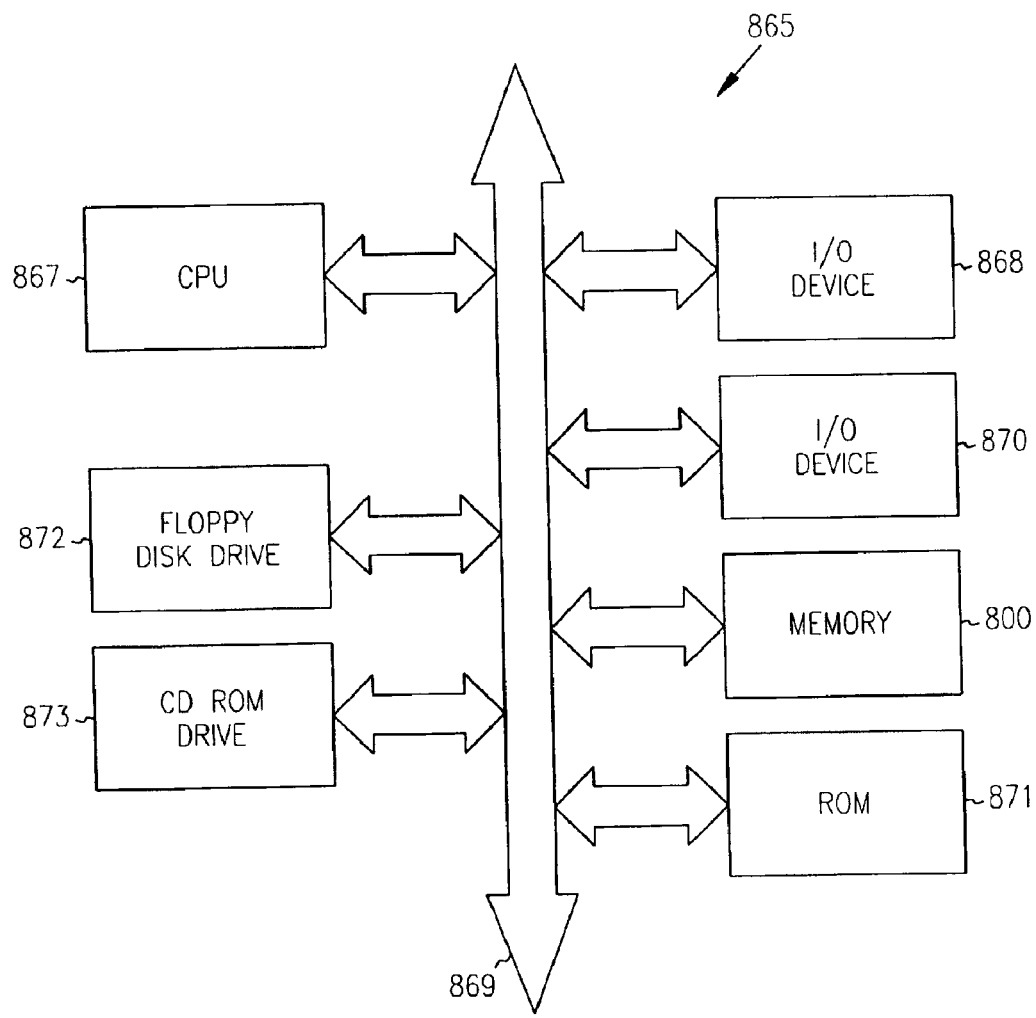
FIG. 8 is a block diagram of an electrical system, or processor-based system, utilizing a memory device constructed in accordance with the present invention.

FIG. 8 is a block diagram of an electrical system, or processor-based system, 865 utilizing memory devices with a trench bit line, formed within a dc biased buried layer according to the teaching of the present invention. By way of example and not by way of limitation, memory device 800 is constructed in accordance with the present invention to have memory cells with a trench bit line formed within a dc biased buried layer. The processor-based system 865 can be a computer system, a process control system or any other system employing a processor and associated memory. The system 865 includes a central processing unit (CPU) 867, e.g., a microprocessor, that communicates with the memory 800 and an I/O device 868 over a bus 869. It must be noted that the bus 869 may be a series of buses and bridges commonly used in a processor-based system, but for convenience purposes only, the bus 869 has been illustrated as a single bus. A second I/O device 870 is illustrated, but is not necessary to practice the invention. The processor-based system 865 can also includes read-only memory (ROM) 871 and may include peripheral devices such as a floppy disk drive 872 and a compact disk (CD) ROM drive 873 that also communicates with the CPU 867 over the bus 869 as is well known in the art.

It will be appreciated by those skilled in the art that additional circuitry and control signals can be provided, and that the memory device 800 has been simplified to help focus on the invention. In one embodiment, at least one of the memory cells within the memory device 800 includes a trench bit line formed within a dc biased buried layer according to the teachings of the present invention.

It will be understood that the embodiment shown in FIG. 8 illustrates an embodiment for electronic system circuitry in which the novel memory cells of the present invention are used. The illustration of system 865, as shown in FIG. 8, is intended to provide a general understanding of one application for the structure and circuitry of the present invention, and is not intended to serve as a complete description of all the elements and features of an electronic system using the novel memory device structures. Further, the invention is equally applicable to any size and type of memory device 800 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Method to Fabricate

Preliminarily, the process steps and structures described herein do not form a complete process flow for manufacturing integrated circuits. Rather, the present invention can be practiced in conjunction with a variety of integrated circuit fabrication techniques, including those techniques currently known or used in the art. As such, not all commonly practiced process steps are disclosed herein. Certain commonly practiced process steps are included in the description herein for example, to provide contextual reference, for illustrative or exemplary purposes, or as is necessary for an understanding of the present invention.

Figure 9A:
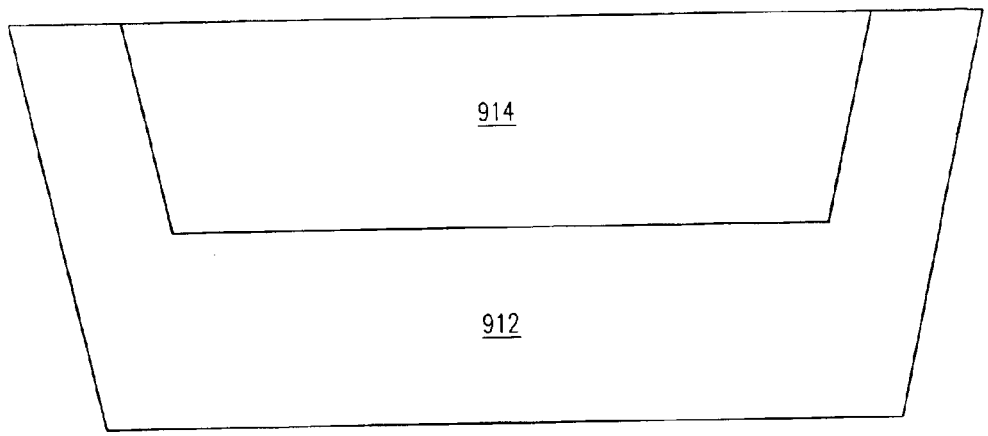
FIGS. 9A–9I illustrate a method of fabrication of a memory device according to the teachings of the present invention.

In FIG. 9A, the fabrication process begins with a substrate 912. The substrate 912 can include any semiconductor material or combination of materials as is known in the art. In one embodiment, by way of example and not by way of limitation, the substrate 912 will include doped or undoped silicon (Si), gallium arsenide (GaAs) or other semiconductor materials such as InP, CdS, or CdTe. The substrate 912 can also include silicon on insulator (SOI), silicon on sapphire (SOS) structure.

In FIG. 9A, an embodiment of the fabrication process continues with the buried layer 914 being formed by a diffusion process. In one embodiment, by way of example and not by way of limitation, doping the substrate 912 with an impurity such as antimony, arsenic, or phosphorus will form an N-type buried layer 914. In an alternative embodiment, doping the base layer with an impurity such as boron forms a P-type buried layer 914. In one embodiment used in order to prevent up diffusion of the impurity, a low temperature process is used. In another embodiment according to the teachings of the present invention, an ion implantation process can be used to create the buried layer 914. The advantage of the ion implantation embodiment, is that it can be performed later in the fabrication process.

Figure 9B:
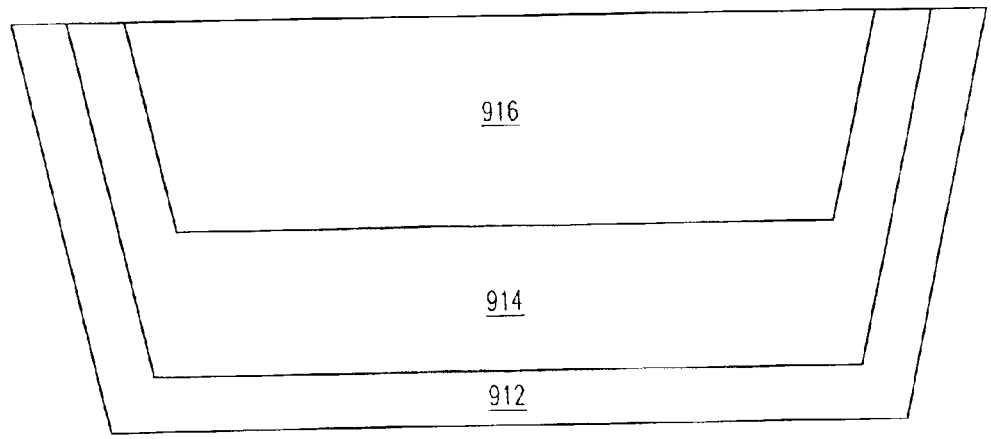

In FIG. 9B, an embodiment of the fabrication process continues when the epitaxial layer 916 is grown on top of the buried layer 914. The epitaxial layer 916 will be doped differently than the buried layer 914. In one embodiment, by way of example and not by way of limitation, the buried layer 914 is doped with impurities such that it is an N-type semiconductor, the epitaxial layer 916 will be grown with impurities such that a P-type semiconductor is formed. FIG. 9B illustrates the triple well feature of this embodiment. The first well being the substrate 912, the second well being the buried layer 914, and the third layer being the epitaxial layer 916. Although not shown from this view, each of the three wells is also formed with a voltage contact region, as shown in FIG. 6, such that the entire well will be biased to a dc voltage level.

Figure 9C:
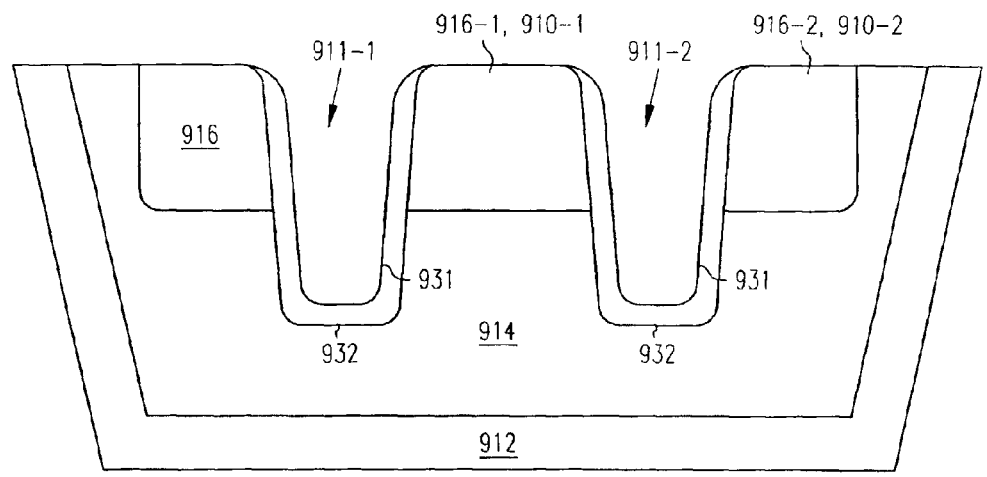

In FIG. 9C, a number of isolation regions or trenches 911-1, 911-2 are formed in the epitaxial region 916, extending into the buried layer 914. In the embodiment of FIG. 9C, two trenches are shown, e.g. 911-1 and 911-2. The invention however is not so limited to any fixed number of trenches. Each trench region 911-1, 911-2 is formed near a strip or region on the surface of the epitaxial layer 916 designated for active area 910-1, 910-2. The trench region is formed with any number of shallow trench isolation (STI) techniques. In one embodiment, by way of example and not by way of limitation, using photolithography and etching techniques, a mask is arranged to define each trench region 911-1, 911-2, aligned generally parallel to the strips designated for active area 910-1, 910-2, respectively. The trench regions 911-1 and 911-2 do not isolate the epitaxial regions 916 entirely from one another, although it appears so from the view of FIG. 9C. Instead, the trench regions 911-1, 911-2 are contained within the epitaxial layer 916, such that a continuous epitaxial region remains continuous around the periphery. As can be seen from the drawing, the buried layer 914 is also uninterrupted, allowing the entire layer to be maintained at a dc voltage by coupling the buried layer 914 to a single contact, although the device is not so limited to a single contact. While STI is shown, any trench forming techniques can be practiced with the present invention.

In the embodiment shown in FIG. 9C, trenches 911-1, 911-2 include a liner 931 and an insulating layer 932 that lines at least a substantial portion of each trench 911-1, 911-2. In one embodiment, by way of example and not by way of limitation, the insulating layer 932 is formed of an oxide. The insulating layer 932 is formed by a thermal oxidation process, which conformally deposits on exposed surfaces. The liner 931 is formed over the insulating layer 932. In one embodiment, by way of example and not by way of limitation, the liner 931 is formed of Nitride. The total spacer thickness required to achieve proper trench isolation varies, but is approximately 250 angstroms. Other techniques can also be used to form the insulating layer 932. By way of example and not by way of limitation, oxides are introduced into the trenches 911-1, 911-2 by low-pressure chemical vapor deposition (LPCVD), plasma enhanced chemical vapor deposition (PECVD), or high pressure oxidation (HIPOX) procedures. Chemical mechanical polishing (CMP) and etching procedures are then used to remove unwanted regions of the oxide insulation region 932. The trenches 911-1, 911-2 will contain additional layers or have a geometry that differs from that shown in the Figures depending upon the isolation characteristics desired for a specific application.

Figure 9D:
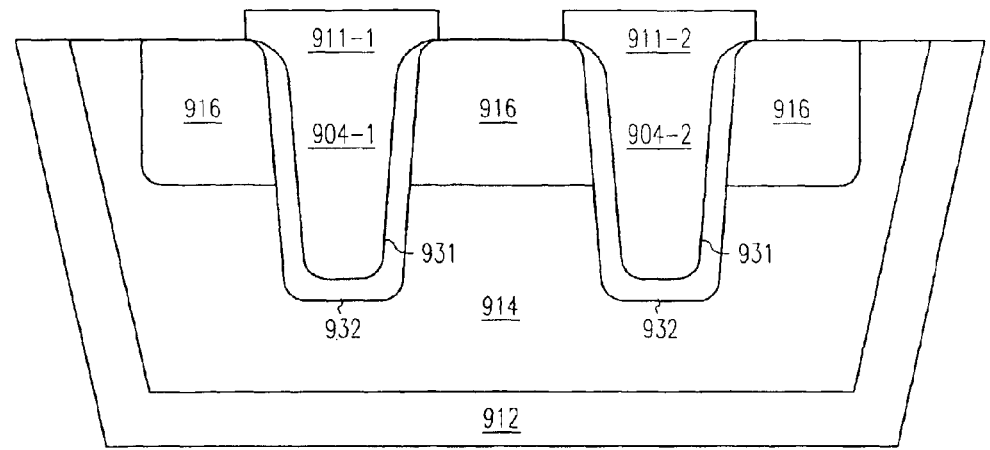

FIG. 9D shows another step of the fabrication process, which details the forming of the conductive trench bit lines 904-1, 904-2 within the trenches 911-1, 911-2 of FIG. 9C. A number of conductive materials can be used to form the trench bit lines 904-1, 904-2, including by way of example and not by way of limitation, tungsten nitride, titanium nitride, titanium silicide, tungsten, and refractory metal silicides. In one embodiment, by way of example and not by way of limitation, a first layer comprising sputtered titanium nitride is formed within each trench 911-1, 911-2 over the nitride layer 931. A second layer is formed over the first layer using a technique such as chemical vapor deposition to deposit a conductive material such as tungsten, tungsten silicide, or boron nitride. An optional third layer of titanium nitride polysilicon, silicon dioxide, or tungsten silicide can be formed over the second layer. Again, any conductive material can be used to form trench bit lines 904-1, 904-2. However, in some embodiments a conductive material with a relatively high melting temperature such as a tungsten-based material including for example, tungsten/titanium nitride or tungsten/tungsten nitride is used.

Figure 9E:
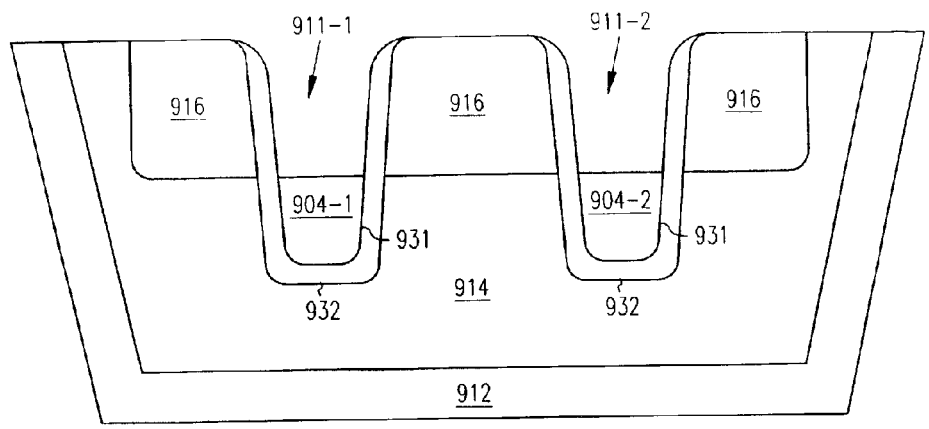

In an embodiment of the present invention shown in FIG. 9E, the trench bit lines 904-1, 904-2 comprises a layer of either titanium nitride or tungsten nitride deposited in the trench regions 911-1 and 911-2. By way of example and not by way of limitation, a layer of tungsten is formed over the titanium nitride using a process such as chemical vapor deposition. In this embodiment, a chemical mechanical polish of the tungsten is then performed to planarize the bit lines 904-1, 904-2, and an etching process is used to recess the bit line 904-1, 904-2 such that the uppermost surface of the trench bit lines 904-1, 904-2 is recessed below the uppermost surface of the epitaxial layer 916. For example, unwanted portions of the trench bit lines 904-1, 904-2 can be removed using a chemical etching process such as ammonium peroxide mixture (APM). Etching in APM allows control of the etch rate, for example, by modifying the etch recipe to change the medium concentration, etch temperature, or combinations thereof. In another embodiment, other etching processes such as sulfuric acid etch with hydrogen peroxide, known in the industry as Piranha etch, can also be used.

Figure 9F:
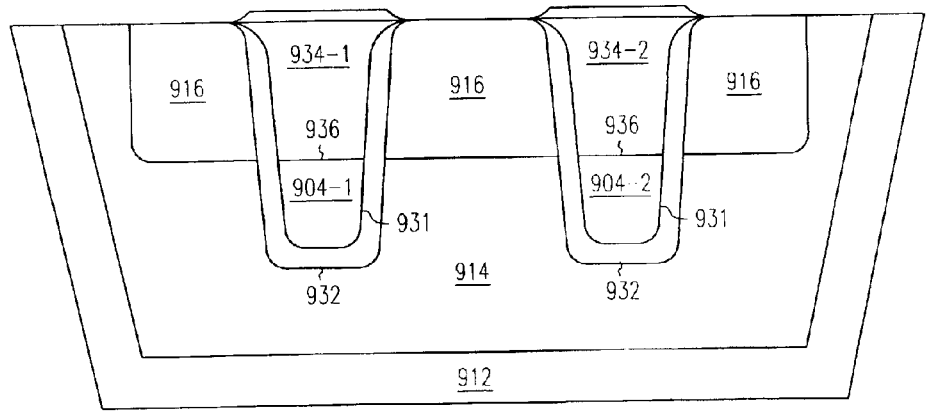

In an embodiment of the present invention shown in FIG. 9F, an insulator capping layer 936 is formed over the trench bit lines 904-1, 904-2. For example, in one embodiment, a layer of nitride is formed to a thickness of approximately 50–100 angstroms using a technique such as PECVD. In one embodiment, Nitride is used to protect the trench bit lines 904-1, 904-2 from oxidizing due to subsequent thermal processes. As shown in FIG. 9F, the trenches 911-1, 911-2 of FIG. 9E are filled with a dielectric capping layer 934-1 and 934-2. The dielectric capping layers 934-1 and 934-2 are located above the trench bit lines 904-1, 904-2. In one embodiment, a low aspect ratio fill of high-density plasma (HDP) can be used to cap off and top each trench region 911-1, 911-2. As one of ordinary skill in the art will understand upon reading this disclosure, in other embodiments, the dielectric capping layer 934 can include other insulating materials such as TEOS, PSG, BSG, and BPSG.

Figure 9G:
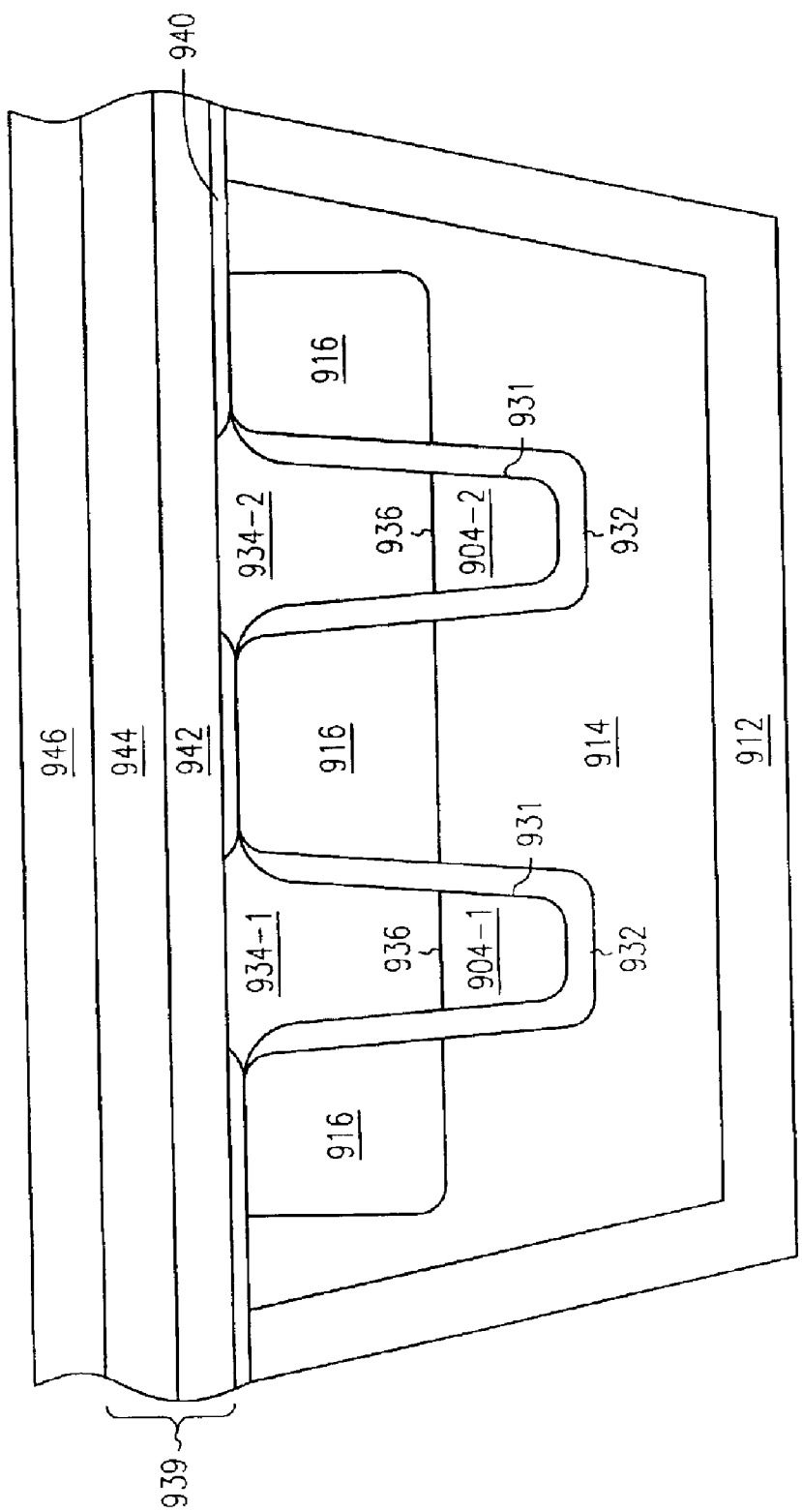

FIG. 9G shows an embodiment of the formation of the wordline 902, in a direction generally perpendicular to the trench bit lines 904-1, 904-2. In one embodiment, the wordline 902 includes a polysilicon gate layer 942 and a conductive layer 944 such as tungsten, tungsten nitride or other conductive material. The wordline 902 is separated from the channel region by a gate oxide 940. An insulating layer 946 is formed on top of the wordline 902.

As shown earlier in FIGS. 1 and 5, isolation devices 134, 534, respectively, are formed parallel with the wordlines 102, 502, respectively. The isolation devices 603 are not used to turn transistors "on" and "off" as wordlines are, and are terminated by a reference voltage such as ground potential. The general construction of wordlines 102, 502 and isolation devices 134, 534, however, are essentially the same. Therefore, in this embodiment according to the teachings of the present invention, the formation of wordlines 902 and isolation devices, shown in FIGS. 1 and 5, is the same. In this embodiment, the gate oxide 940 can be grown by thermal oxidation of the epitaxial layer 916. In another embodiment, the gate oxide 940 can be formed by other techniques such as chemical vapor deposition (CVD). It will be appreciated that when growing the gate oxide 940, the oxide will form on any exposed silicon surface, thus removal of portions of the gate oxide 940 from the surface of the epitaxial layer 916 may be required as the specific application dictates.

The polysilicon gate layer 942 can be formed using any number of processing techniques including LPCVD. A doping of the polysilicon gate layer 942 is needed to enhance gate performance. In one embodiment, by way of example and not by way of limitation, the polysilicon gate layer 942 is doped with an N-type impurity such as Arsenic or Phosphorous for the wordline. In contrast the electrode 534 for the isolation gate in FIG. 5 can be doped p-type, left undoped, or doped n-type. After the appropriate ion implants the polysilicon gate layer 942 can optionally be annealed.

Figure 9H:
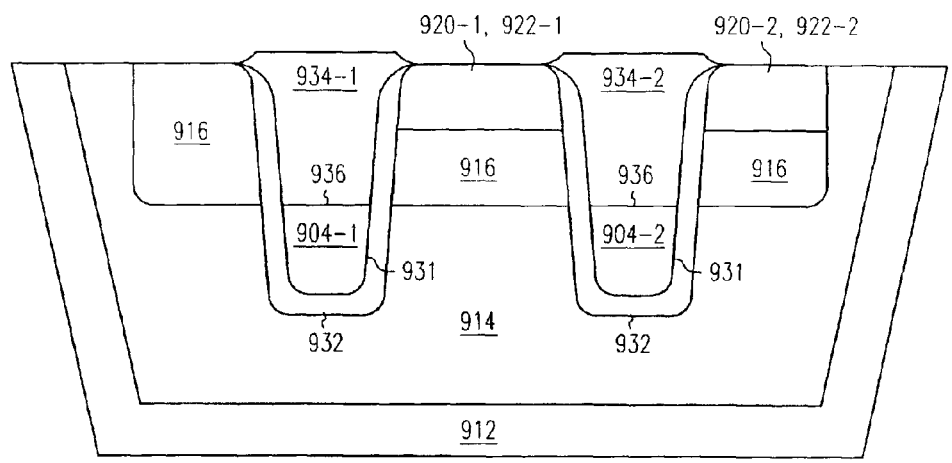

FIG. 9H illustrates the formation of the source 920 and drain regions 922 according to the teachings of the present invention, which can be done by an ion implantation process. The type of implant used to define the source/drain regions 920, 922 will depend upon the type of well formed. In one embodiment, by way of example and not by way of limitation, where the well is a P-type well, the source/drain regions 920, 922 can be formed by an N-type dopant such as phosphorous or arsenic. In other embodiments, implants such as halo implants can also optionally be performed at this time.

Once all of the ion implants have been performed, the memory device is annealed as necessary, to thermally activate the various dopants and the ion implants heretofore discussed. The high temperature anneal steps may cause thermal expansion of the trench bit lines 904-1, 904-2 buried in the trenches. Thermal expansion and other potentially adverse effects cause by high temperature processing may lead to defective formation of memory cells. One way to reduce the likelihood of damage to the memory cells is to use low temperature processing. Alternatively, in another embodiment, the trench bit lines 904-1, 904-2 can be formed late in the fabrication of the memory device, subsequent to the formation of components that require high temperature processing. Further, selective oxidation, such as that used for forming tungsten wordlines can be used.

Figure 9I:
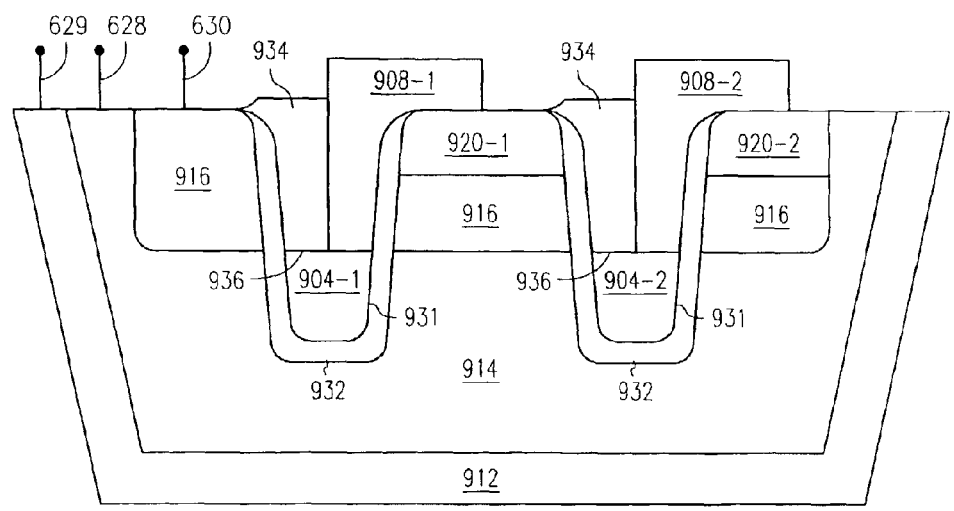

FIG. 9I illustrate an embodiment of the present invention detailing the formation of the bit contacts 908 between the drain regions 920-1, 920-2 and the trench bit lines 904-1, 904-2. The contact openings can be formed using any number of techniques. In one embodiment, by way of example and not by way of limitation, it is advantageous to perform a self-aligned contact etch. Basically, a first etch is performed using a chemistry, such as a CxFy (x>1), or other chemistry that can etch selectively through oxide and still leave the spacer material intact. In this embodiment, the first chemistry should have good selectivity to silicon nitride that forms the silicon nitride spacers on the wordlines 902. The first chemistry should have good selectivity to isolation regions however, thus, the etch is performed through any oxide layers over the substrate 912 and preferably extends into the trenches 911-1, 911-2 as shown in FIGS. 9C, 9D, and 9E. To complete the formation of the contact, a second etch using, by way of example and not by way of limitation, a hydrogen containing fluorocarbon chemistry to open up a connection to the trench bit lines 904-1, 904-2. In other embodiments, a high density plasma (HDP) etcher, reactive ion etcher (RIE), or magnetically enhanced reactive ion etcher (MERIE) are used to perform the self-aligned contact etch.

As illustrated in FIG. 9I, a conductive bit contact 908-1, 908-2 is formed to electrically couple the trench bit lines 904-1, 904-2 to the corresponding drain regions 920-1, 920-2. As illustrated in one embodiment, the bit contact 908-1, 908-2 extends substantially vertically from the trench bit lines 904-1, 904-2, respectively, contacts a first portion of the drain region 920-1, 920-2 along a vertical dimension, then folds over to contact the drain region 920-1, 920-2 along the uppermost surface of the drain region 920-1, 920-2. In one embodiment, by way of example and not by way of limitation, the bit contacts 908-1, 908-2 include doped polysilicon, tungsten, or any other conductive material including those discussed with reference to the formation of the trench bit lines 904-1, 904-2.

With the trench bit line architecture, the bit lines are no longer connected to the drain regions through vias formed above the transistor. This arrangement can be used to realize deeper and therefore larger capacitors and hence increased capacitance and greater refresh times, or a reduction in the overall size of the memory device. A capacitor can be formed by a number of different techniques, and then coupled to the source region of the transistor. It shall be appreciated that additional processing steps can be performed to connect the circuit elements and layers of metallization. For example, in one embodiment, back end of line wiring (BEOL) can be used to ground the isolation devices and perform any other miscellaneous operations. The BEOL wiring completes the circuits designed within the integrated circuit device. Any other semiconductor fabrication techniques can also be employed as is known in the art to complete the desired structure.

CONCLUSION

This disclosure describes the use of trench bit lines formed within a buried layer in order to reduce or diminish capacitive coupling problems between the bit lines and the substrate, and between neighboring bit lines when used in memory devices utilizing an open bit line architecture. The memory array will consist of three wells, including a base substrate, the buried layer, and an epitaxial layer, all of which are held at solid potentials by voltage contacts coupling the layers to dc voltage levels.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory cell, comprising:
   a transistor formed on a substrate having a source and a drain region separated by a channel;
   a bit contact coupled to the drain region; and a trench bit line coupled to the bit contact wherein the trench bit line is formed in a buried layer in the substrate, and wherein the buried layer can be solidly held at a dc bias.

2. The memory cell of claim 1, wherein the source region and drain region are formed in a P-type epitaxial layer, and wherein the P-type epitaxial layer serves as the channel between the source region and the drain region.

3. The memory cell of claim 2, wherein the source region and the drain region includes an N-type semiconductor material.

4. The memory cell of claim 1, wherein the buried layer includes a heavily doped n+type semiconductor material.

5. The memory cell of claim 1, wherein the substrate includes a P-type semiconductor material.

6. The memory cell of claim 1, wherein the bit contact includes a Titanium Silicide/Titanium Nitride alloy (TiSi/TiN).

7. The memory cell of claim 1, wherein the trench bit line includes a Tungsten/Tungsten Nitride alloy (W/WN).

8. The memory cell of claim 1, wherein the memory cell further includes a layer surrounding the trench bit line, and wherein the layer surrounding the trench bit line includes a Nitride liner.

9. The memory cell of claim 1, wherein the memory cell further includes an oxide layer separating the trench bit line from the buried layer.

10. A memory cell, comprising:
a transistor formed on a substrate having a source region and a drain region formed in a P-type epitaxial layer, where the P-type epitaxial layer serves as a channel between the source region and the drain region;
a bit contact coupled to the drain region; and
a trench bit line coupled to the bit contact and formed in a heavily doped N-type buried layer, and wherein the heavily doped N-type buried layer is capable of being firmly held at a dc bias.

11. The memory cell of claim 10, wherein a voltage bias contact is coupled to the P-type epitaxial layer.

12. The memory cell of claim 10, wherein the memory cell includes a voltage bias contact coupled to the buried layer.

13. The memory cell of claim 10, wherein the memory cell includes a voltage bias contact coupled to the substrate.

14. The memory cell of claim 10, wherein the bit contact includes a Titanium Silicide/Titanium Nitride alloy(TiSi/TiN).

15. The memory cell of claim 10, wherein the trench bit line includes a Tungsten/Tungsten Nitride alloy (W/WN).

16. The memory cell of claim 10, wherein the memory cell further includes a liner surrounding the trench bit line, and wherein the liner surrounding the trench bit line includes Nitride.

17. The memory cell of claim 10, wherein the memory cell further includes a layer separating the trench bit line from the N-buried layer, and wherein the layer separating the trench bit line from the N-buried layer includes Oxide.

18. A memory cell, comprising:
a transistor formed on a P-type substrate having an N-type source and an N-type drain region formed in a P-type epitaxial layer;
a voltage bias contact coupled to the P-type epitaxial layer;
a bit contact coupled to the drain region;
a trench bit line coupled to the bit contact and formed in a heavily doped N-type buried layer, and wherein the buried layer is capable of being fixed at a dc bias;
a voltage bias contact coupled to the heavily doped N-type buried layer; and
a voltage bias contact coupled to the P-type substrate.

19. The memory cell of claim 18, wherein the voltage bias contact coupled to the P-type epitaxial layer maintains a zero (0) or negative voltage level.

20. The memory cell of claim 18, wherein the voltage bias contact coupled to the heavily doped N-type buried layer maintains a zero (0) or positive voltage level.

21. The memory cell of claim 18 wherein the voltage bias contact coupled to the P-type substrate is coupled to ground potential.

22. The memory cell of claim 18, wherein the bit contact includes a Titanium Suicide/Titanium Nitride alloy (TiSi/TiN).

23. The memory cell of claim 18, wherein the trench bit line includes a Tungsten/Tungsten Nitride alloy (W/WN).

24. A memory device, comprising:
a number of memory cells arrayed in rows and columns, wherein each memory cell includes a transistor formed on a substrate having a source region and a drain region separated by a channel;
a number of bit contacts coupled to the drain regions; and
a number of trench bit lines coupled to the bit contacts along rows of the array, wherein each trench bit line is formed in a buried layer in the substrate, and wherein each buried layer is capable of being firmly held at a dc bias.

25. The memory device of claim 24, wherein each trench bit line includes a Tungsten/Tungsten Nitride alloy (W/WN).

26. The memory device of claim 24, wherein each trench bit line is coupled to the drain region of a number of transistors via a number of bit contacts, wherein the bit contacts include a Titanium Silicide/Titanium Nitride alloy (TiSi/TiN).

27. The memory device of claim 24, wherein each trench bit line is formed within the buried layer, in an alignment which is parallel to the alignment of the source and the drain regions of the transistors.

28. The memory device of claim 24, wherein a number of word lines are formed opposing the channel of a number of transistors along columns of the memory device.

29. The memory device of claim 24, wherein the number of word lines are formed orthogonal to the number of trench bit lines, and wherein an isolation gate stack separates column adjacent cells.

30. The memory device of claim 24, wherein each trench bit line is coupled to a sense amplifier.

31. A memory device, comprising:
a number of memory cells, wherein each memory cell includes a transistor formed on a substrate having a source region and a drain region formed in a P-type epitaxial layer, wherein the P-type epitaxial layer serves as a channel between the source and drain regions;
a number of bit contacts coupled to the drain regions;
a number of trench bit lines formed in a heavily doped N-type buried layer coupled to the bit contacts, and wherein the buried layer is capable of being held at a fixed dc voltage level;
a number of wordlines are formed opposing the channel region of the transistors; and
a number of sense amplifiers.

32. The memory device of claim 31, wherein each trench bit line includes a Tungsten/Tungsten Nitride alloy (W/WN).

33. The memory device of claim 31, wherein each trench bit line is coupled to a number of transistor drain regions via a number of bit contacts, wherein the bit contacts include a Titanium Silicide/Titanium Nitride alloy (TiSi/TiN).

34. The memory device of claim 31, wherein each trench bit line is formed within the buried layer, in an alignment which is parallel to the alignment of the source and the drain regions of the transistors.

35. The memory device of claim 31, wherein each trench bit line is coupled to a number of transistor drain regions along rows of the memory device.

36. The memory device of claim 31, wherein each wordline is formed opposing the channel of a number of transistors along columns of the memory device.

37. The memory device of claim 31, wherein each word line is formed orthogonal to the trench bit lines.

38. The memory device of claim 31, wherein each trench bit line is coupled to a sense amplifier.

39. The memory device of claim 31, wherein an open bit line architecture is used in placement of the word lines, the trench bit lines, the memory cells, and the sense amplifiers.

40. An electronic system, comprising:
a processor; and
a memory device coupled thereto, wherein the memory device has a number of memory cells wherein the memory cell includes:
a transistor formed on a substrate having a source region and a drain region separated by a channel;
a bit contact coupled to the drain region; and
a trench bit line coupled to the bit contact wherein the trench bit line is formed in a buried layer within a substrate, and wherein the buried layer is capable of being held at a constant dc voltage level.

41. The electronic system of claim 40, wherein the source and drain are formed in a P-type epitaxial layer.

42. The electronic system of claim 40, wherein a voltage bias contact is coupled to the P-type epitaxial layer.

43. The electronic system of claim 40, wherein buried layer includes a voltage bias contact, and wherein the buried layer includes a heavily doped polysilicon layer.

44. The electronic system of claim 40, wherein a voltage bias contact is coupled to the substrate.

45. The electronic system of claim 40, wherein the trench bit line includes a high conductivity, low resistivity refractory metal.

46. The electronic system of claim 40, wherein the memory cell includes a layer surrounding the trench bit line, wherein the layer surrounding the trench bit line includes a Nitride liner.

47. The electronic system of claim 40, wherein the memory cell further includes an oxide layer separating the trench bit line from the buried layer.

48. The electronic system of claim 40, comprising:
a number of wordlines, wherein each wordline is formed opposing the channel region of the transistor located in a memory cell;
a number of trench bit lines, wherein each trench bit line is coupled to the drain region of the transistor located in the memory cell; and
a number of address decoders coupled to the word lines and trench bit lines.

49. A method for operating a memory cell, comprising:
receiving an address for the memory cell;
using a wordline corresponding to the received address to turn on a transistor in the memory cell;
coupling a trench bit line to a storage node through the transistor; and
coupling a fixed dc bias to a buried layer surrounding the trench bit line.

50. A method for reading a memory cell, comprising:
receiving an address for the memory cell;
using a wordline corresponding to the received address to turn on a transistor in the memory cell;
coupling a trench bit line to a storage node through the transistor;
coupling a fixed dc bias to a buried layer surrounding the trench bit line; and
sensing the voltage change on the trench bit line.

51. A method for writing a memory cell that includes:
receiving an address for the memory cell;
using a wordline corresponding to the received address to turn on a transistor in the memory cell;
coupling a trench bit line to a storage node through the transistor;
coupling a fixed dc bias to a buried layer surrounding the trench bit line; and
storing the appropriate charge on the storage device.

52. A method of forming a memory cell on a semiconductor substrate, comprising:
forming a transistor, wherein forming the transistor includes forming a source region and forming a drain region on a P-type epitaxial layer;
forming a trench bit line that couples to a bit contact, wherein forming the trench bit line includes forming the trench bit line in a buried layer capable of being held at a fixed dc bias;
forming the bit contact that couples to the drain region of the transistor,
forming a word line that opposes the channel region of the transistor;
forming a storage node that couples to the source region of the transistor; and
forming a sense amplifier that couples to the trench bit line in the buried layer.

53. The method of claim 52, wherein forming the trench bit line in a buried layer capable of being held at a fixed dc bias includes forming a layer surrounding the trench bit line wherein the layer surrounding the trench bit line includes a Nitride liner.

54. The method of claim 52, wherein forming the trench bit line in a buried layer capable of being held at a fixed dc bias includes forming an oxide layer separating the trench bit line from the buried layer.

55. A method of forming a memory cell array on a semiconductor substrate, comprising:
within a P-type substrate, forming an N-type buried layer capable of being held at a fixed dc bias;
forming a lightly doped P-type epitaxial layer on top of the N-type buried layer;
forming a number of source and drain regions for one or more transistors in the P-type epitaxial layer;
forming a number of trenches parallel to an alignment of the source and the drain regions of the transistors formed in the P-type epitaxial layer;
forming a bit line in each trench and separated from the N-type buried layer by an insulator;
forming a bit line contact coupling each trench bit line to the drain of each transistor; and
forming a number of storage nodes.

56. The method of claim 55, wherein forming the N-type buried layer includes forming a voltage bias contact, and wherein the N-type buried layer includes a heavily doped buried layer.

57. The method of claim 55, wherein forming the P-type epitaxial layer on top of the N-type buried layer includes forming a voltage bias contact coupled to the P-type epitaxial layer.

58. The method of claim 55, wherein forming the P-type substrate layer includes forming a voltage bias contact coupled to the P-type substrate layer.

59. The method of claim 55, wherein the method is a triple well process.

60. A method of forming a memory cell on a semiconductor substrate, comprising:

forming a transistor according to a triple well process; and
   forming a trench bit line adjacent to the transistor and located in a buried layer.

61. The method of claim 60, wherein forming the memory cell includes forming the trench bit line in a buried layer capable of being held at a fixed bias.

62. The method of claim 60, wherein forming the memory cell includes forming the buried layer as part of the triple well process.

* * * * *

UNITED STATES PATENT AND TRADEMARK OFFICE
CERTIFICATE OF CORRECTION

PATENT NO. : 6,894,915 B2
DATED : May 17, 2005
INVENTOR(S) : Tran

It is certified that error appears in the above-identified patent and that said Letters Patent is hereby corrected as shown below:

Title page,
Item [56], References Cited, U.S. PATENT DOCUMENTS, after "Tran" delete "et al.".
Item [57], ABSTRACT,
Line 6, delete "de" and insert -- dc --, therefor.

Drawings,
Sheet 6 of 15, in Block 415, below "426-1" delete "415" and insert -- 416 --, therefor.

Column 1,
Line 40, after "level 0" insert -- . --.

Column 18,
Line 13, delete "Suicide" and insert -- Silicide --, therefor.

Column 20,
Line 31, after "transistor" delete "," and insert -- ; --, therefor.

Signed and Sealed this

Fourth Day of October, 2005

JON W. DUDAS
*Director of the United States Patent and Trademark Office*